US010236033B2

(12) United States Patent
Koyama et al.

(10) Patent No.: US 10,236,033 B2
(45) Date of Patent: *Mar. 19, 2019

(54) MEMORY DEVICE AND SEMICONDUCTOR DEVICE

(71) Applicant: Semiconductor Energy Laboratory Co., Ltd., Atsugi-shi, Kanagawa-ken (JP)

(72) Inventors: Jun Koyama, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/076,747

(22) Filed: Mar. 22, 2016

(65) Prior Publication Data

US 2016/0203849 A1 Jul. 14, 2016

Related U.S. Application Data

(63) Continuation of application No. 14/679,103, filed on Apr. 6, 2015, now Pat. No. 9,299,393, which is a (Continued)

(30) Foreign Application Priority Data

Sep. 14, 2010 (JP) .................. 2010-205253
May 19, 2011 (JP) .................. 2011-112791

(51) Int. Cl.
*G11C 5/02* (2006.01)
*G11C 5/10* (2006.01)
(Continued)

(52) U.S. Cl.
CPC .................. *G11C 5/10* (2013.01); *G11C 7/12* (2013.01); *G11C 7/18* (2013.01); *G11C 11/4085* (2013.01);
(Continued)

(58) Field of Classification Search
CPC ... G11C 5/10; G11C 11/4085; G11C 11/4094; G11C 11/4097; G11C 7/12; G11C 7/18;
(Continued)

(56) References Cited

U.S. PATENT DOCUMENTS 4,982,372 A 1/1991 Matsuo
5,184,321 A 2/1993 Konishi et al.
(Continued)

FOREIGN PATENT DOCUMENTS

CN 001574063 A 2/2005
CN 101599437 A 12/2009
(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.
(Continued)

*Primary Examiner* — Tha-O H Bui
(74) *Attorney, Agent, or Firm* — Fish & Richardson P.C.

(57) ABSTRACT

An object of one embodiment of the present invention is to propose a memory device in which a period in which data is held is ensured and memory capacity per unit area can be increased. In the memory device of one embodiment of the present invention, bit lines are divided into groups, and word lines are also divided into groups. The word lines assigned to one group are connected to the memory cell connected to the bit lines assigned to the one group. Further, the driving
(Continued)

of each group of bit lines is controlled by a dedicated bit line driver circuit of a plurality of bit line driver circuits. In addition, cell arrays are formed on a driver circuit including the above plurality of bit line driver circuits and a word line driver circuit. The driver circuit and the cell arrays overlap each other.

14 Claims, 28 Drawing Sheets

Related U.S. Application Data continuation of application No. 13/231,155, filed on Sep. 13, 2011, now Pat. No. 9,007,812.

(51) Int. Cl.
| | |
|---|---|
| *G11C 7/12* | (2006.01) |
| *G11C 7/18* | (2006.01) |
| *G11C 11/408* | (2006.01) |
| *G11C 11/4094* | (2006.01) |
| *G11C 11/4097* | (2006.01) |
| *H01L 27/02* | (2006.01) |
| *H01L 27/06* | (2006.01) |
| *H01L 27/108* | (2006.01) |
| *H01L 27/12* | (2006.01) |
| *H01L 29/786* | (2006.01) |

(52) U.S. Cl.
CPC ...... *G11C 11/4094* (2013.01); *G11C 11/4097* (2013.01); *H01L 27/0207* (2013.01); *H01L 27/0688* (2013.01); *H01L 27/10805* (2013.01); *H01L 27/10873* (2013.01); *H01L 27/10897* (2013.01); *H01L 27/1207* (2013.01); *H01L 29/7869* (2013.01); *H01L 27/10885* (2013.01); *H01L 27/1225* (2013.01)

(58) Field of Classification Search
CPC .......... H01L 27/10805; H01L 27/0207; H01L 27/0688; H01L 27/10873; H01L 29/7869; H01L 27/10897; H01L 27/1207; H01L 27/1225
USPC .... 365/65, 106, 129, 113, 145, 149, 163, 51
See application file for complete search history.

(56) References Cited

U.S. PATENT DOCUMENTS

| | | |
|---|---|---|
| 5,687,123 A | 11/1997 | Hidaka et al. |
| 5,731,856 A | 3/1998 | Kim et al. |
| 5,744,864 A | 4/1998 | Cillessen et al. |
| 5,818,748 A * | 10/1998 | Bertin .............. G11C 5/025 257/686 |
| 5,943,273 A | 8/1999 | Hidaka et al. |
| 6,029,963 A | 2/2000 | Saeki |
| 6,272,055 B1 | 8/2001 | Hidaka et al. |
| 6,278,628 B1 | 8/2001 | Sekiguchi et al. |
| 6,282,113 B1 | 8/2001 | Debrosse |
| 6,294,274 B1 | 9/2001 | Kawazoe et al. |
| 6,399,988 B1 | 6/2002 | Yamazaki |
| 6,414,883 B2 | 7/2002 | Hidaka et al. |
| 6,426,889 B2 | 7/2002 | Sekiguchi et al. |
| 6,445,636 B1 | 9/2002 | Keeth et al. |
| 6,563,174 B2 | 5/2003 | Kawasaki et al. |
| 6,574,148 B2 | 6/2003 | Chevallier |
| 6,576,943 B1 | 6/2003 | Ishii et al. |
| 6,579,736 B2 | 6/2003 | Yamazaki |
| 6,625,051 B2 | 9/2003 | Sekiguchi et al. |
| 6,727,522 B1 | 4/2004 | Kawasaki et al. |
| 6,765,813 B2 * | 7/2004 | Scheuerlein .......... G11C 5/025 365/51 |
| 6,839,260 B2 | 1/2005 | Ishii |
| 6,859,403 B2 | 2/2005 | Hidaka et al. |
| 6,876,023 B2 | 4/2005 | Ishii et al. |
| 6,882,008 B1 | 4/2005 | Ohsawa |
| 6,898,683 B2 | 5/2005 | Nakamura |
| 6,952,363 B2 | 10/2005 | Song et al. |
| 7,030,438 B2 | 4/2006 | Sekiguchi et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,088,603 B2 | 8/2006 | Patel |
| 7,105,868 B2 | 9/2006 | Nause et al. |
| 7,177,187 B2 | 2/2007 | Ishii |
| 7,211,825 B2 | 5/2007 | Shih et al. |
| 7,282,782 B2 | 10/2007 | Hoffman et al. |
| 7,289,346 B2 | 10/2007 | Sekiguchi et al. |
| 7,297,977 B2 | 11/2007 | Hoffman et al. |
| 7,323,356 B2 | 1/2008 | Hosono et al. |
| 7,335,906 B2 | 2/2008 | Toda |
| 7,336,519 B2 | 2/2008 | Ishii |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,459,715 B2 | 12/2008 | Toda et al. |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,570,516 B2 | 8/2009 | Ishii |
| 7,674,650 B2 | 3/2010 | Akimoto et al. |
| 7,729,158 B2 | 6/2010 | Toda et al. |
| 7,732,819 B2 | 6/2010 | Akimoto et al. |
| 7,750,334 B2 | 7/2010 | Toda |
| 7,778,069 B2 * | 8/2010 | Matsuzaki ............ G11C 11/005 365/113 |
| 7,821,804 B2 | 10/2010 | Sekiguchi et al. |
| 7,826,266 B2 | 11/2010 | Ishii |
| 7,889,538 B2 | 2/2011 | Toda |
| 8,022,381 B2 | 9/2011 | Toda |
| 8,044,448 B2 | 10/2011 | Kamigaichi et al. |
| 8,044,456 B2 | 10/2011 | Nagashima et al. |
| 8,164,555 B2 | 4/2012 | Miyake et al. |
| 8,202,365 B2 | 6/2012 | Umeda et al. |
| 8,237,143 B2 | 8/2012 | Toda |
| 8,258,496 B2 | 9/2012 | Toda et al. |
| 8,378,341 B2 | 2/2013 | Hayashi et al. |
| 8,378,403 B2 | 2/2013 | Kato |
| 8,455,868 B2 | 6/2013 | Yamazaki et al. |
| 8,482,001 B2 | 7/2013 | Yamazaki et al. |
| 8,513,731 B2 | 8/2013 | Lee et al. |
| 8,530,246 B2 | 9/2013 | Ofuji et al. |
| 8,610,187 B2 | 12/2013 | Yamazaki et al. |
| 8,649,201 B2 | 2/2014 | Kato et al. |
| RE45,480 E | 4/2015 | Nagashima et al. |
| 9,007,812 B2 * | 4/2015 | Koyama ............ G11C 7/12 365/51 |
| 9,129,937 B2 | 9/2015 | Hayashi et al. |
| 9,299,393 B2 * | 3/2016 | Koyama ............ G11C 7/12 |
| 2001/0033030 A1 | 10/2001 | Leedy |
| 2001/0046027 A1 | 11/2001 | Tai et al. |
| 2002/0056838 A1 | 5/2002 | Ogawa |
| 2002/0078316 A1 | 6/2002 | Nakamura |
| 2002/0132454 A1 | 9/2002 | Ohtsu et al. |
| 2002/0149973 A1 | 10/2002 | Hidaka et al. |
| 2002/0163834 A1 | 11/2002 | Scheuerlein et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0205921 A1 | 9/2005 | Ishii et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |

(56) References Cited

U.S. PATENT DOCUMENTS

| | | |
|---|---|---|
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0144349 A1 | 6/2008 | Kato et al. |
| 2008/0166834 A1 | 7/2008 | Kim et al. |
| 2008/0175038 A1 | 7/2008 | Arimoto et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0266925 A1 | 10/2008 | Lukes et al. |
| 2008/0296568 A1 | 12/2008 | Ryu et al. |
| 2008/0316821 A1 | 12/2008 | Yokoi |
| 2009/0065843 A1 | 3/2009 | Nomura et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0237985 A1 | 9/2009 | Matsuzaki et al. |
| 2009/0261315 A1 | 10/2009 | Toda et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0187523 A1 | 7/2010 | Sakata et al. |
| 2010/0290262 A1 | 11/2010 | Scheuerlein et al. |
| 2011/0089419 A1 | 4/2011 | Yamazaki et al. |
| 2011/0101334 A1 | 5/2011 | Yamazaki et al. |
| 2011/0114946 A1 | 5/2011 | Saito |
| 2015/0287832 A1 | 10/2015 | Hayashi et al. |

FOREIGN PATENT DOCUMENTS

| | | |
|---|---|---|
| EP | 1120791 A | 8/2001 |
| EP | 1737044 A | 12/2006 |
| EP | 1978502 A | 10/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-154462 A | 6/1990 |
| JP | 05-251705 A | 9/1993 |
| JP | 07-240093 A | 9/1995 |
| JP | 08-264794 A | 10/1996 |
| JP | 11-505377 | 5/1999 |
| JP | 2000-044236 A | 2/2000 |
| JP | 2000-058785 A | 2/2000 |
| JP | 2000-150900 A | 5/2000 |
| JP | 2000-269457 A | 9/2000 |
| JP | 2000-277709 A | 10/2000 |
| JP | 2000-349299 A | 12/2000 |
| JP | 2001-274355 A | 10/2001 |
| JP | 2002-076356 A | 3/2002 |
| JP | 2002-289859 A | 10/2002 |
| JP | 2002-319682 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-136191 A | 5/2005 |
| JP | 2006-514440 | 4/2006 |
| JP | 2007-042172 A | 2/2007 |
| JP | 2007-096055 A | 4/2007 |
| JP | 2007-123861 A | 5/2007 |
| JP | 2008-276188 A | 11/2008 |
| JP | 2009-135350 A | 6/2009 |
| JP | 2009-167087 A | 7/2009 |
| JP | 2009-260060 A | 11/2009 |
| JP | 2009-277702 A | 11/2009 |
| JP | 2010-020863 A | 1/2010 |
| JP | 2010-034109 A | 2/2010 |
| JP | 2010-045205 A | 2/2010 |
| JP | 2010-118659 A | 5/2010 |
| JP | 2010-141230 A | 6/2010 |
| WO | WO-2000/021092 | 4/2000 |
| WO | WO-2000/055920 | 9/2000 |
| WO | WO-2004/090984 | 10/2004 |
| WO | WO-2004/114391 | 12/2004 |
| WO | WO-2006/080478 | 8/2006 |
| WO | WO-2009/139482 | 11/2009 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

(56) References Cited

OTHER PUBLICATIONS

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AMOLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

(56) References Cited

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "SPINEL,YbFe2O4, and Yb2Fe3O7 Types of Structures for Compounds in the In2O3 and Sc2O3—A2O3—BO SYSTEMS [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW'08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Chinese Office Action (Application No. 201110284005.8) dated Jul. 13, 2015.

Taiwanese Office Action (Application No. 100132269) dated Nov. 3, 2015.

Taiwanese Office Action (Application No. 105110305) dated Mar. 23, 2017.

Park.S et al., "Transparent and Photo-stable ZnO Thin-film Transistors to Drive an Active Matrix Organic-Light-Emitting-Diode Display Panel", Adv. Mater. (Advanced Materials), Dec. 4, 2008, vol. 21, No. 6, pp. 678-682.

Korean Office Action (Application No. 2011-0091829) dated Jan. 29, 2018.

Taiwanese Office Action (Application No. 105110305) dated Feb. 22, 2018.

Chinese Office Action (Application No. 201610685610.9) dated Nov. 26, 2018.

Taiwanese Office Action (Application No. 105110305) dated Nov. 28, 2018.

\* cited by examiner

● In
◡ Sn
◡ Zn
● O

FIG. 14A  FIG. 14B  FIG. 14C
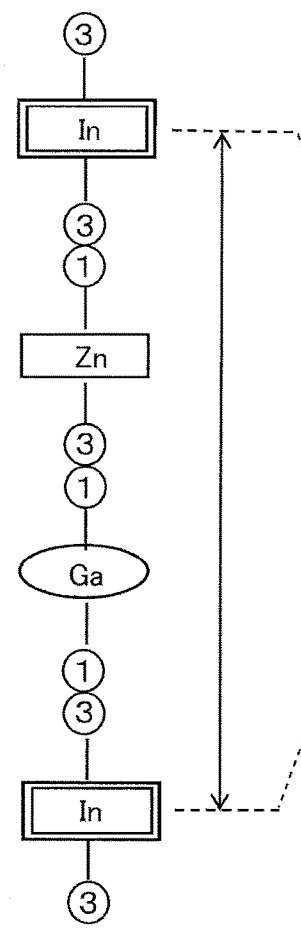
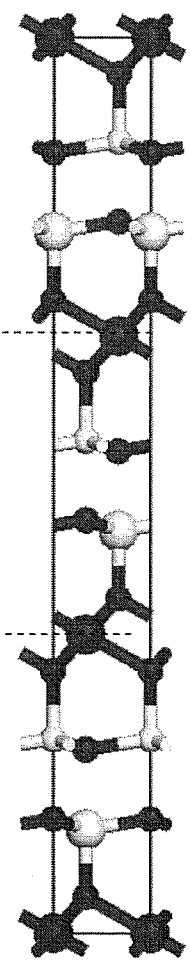
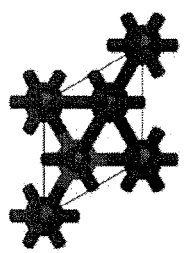
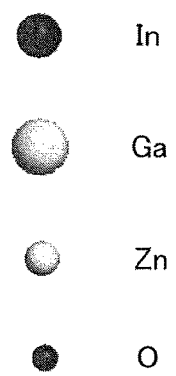
- In
- Ga
- Zn
- O

MEMORY DEVICE AND SEMICONDUCTOR DEVICE

CROSS-REFERENCE TO RELATED APPLICATIONS

This application is a continuation of U.S. application Ser. No. 14/679,103, filed Apr. 6, 2015, now allowed, which is a continuation of U.S. application Ser. No. 13/231,155, filed Sep. 13, 2011, now U.S. Pat. No. 9,007,812, which claims the benefit of foreign priority applications filed in Japan as Serial No. 2010-205253 on Sep. 14, 2010, and Serial No. 2011-112791 on May 19, 2011, all of which are incorporated by reference.

BACKGROUND OF THE INVENTION

1. Field of the Invention

The present invention relates to a memory device. Further, the present invention relates to a semiconductor device including the memory device.

2. Description of the Related Art

In recent years, a metal oxide having semiconductor characteristics, which is called an oxide semiconductor having high mobility and uniform element characteristics, has attracted attention as a material of an active layer of a transistor. Various metal oxides are used for a variety of applications. For example, indium oxide is used as a material of a pixel electrode in a liquid crystal display device. Examples of such metal oxides having semiconductor characteristics include tungsten oxide, tin oxide, indium oxide, and zinc oxide. Transistors in each of which a channel formation region is formed using such a metal oxide having semiconductor characteristics have been known (Patent Documents 1 and 2).

REFERENCE

[Patent Document 1] Japanese Published Patent Application No. 2007-123861
[Patent Document 2] Japanese Published Patent Application No. 2007-096055

SUMMARY OF THE INVENTION

Examples of a semiconductor memory device (hereinafter also simply referred to as a memory device) include a DRAM and an SRAM, which are categorized as volatile memories; a mask ROM, an EPROM, an EEPROM, a flash memory, and a ferroelectric memory, which are categorized as non-volatile memories; and the like. Most of these memories formed using single crystal semiconductor substrates have already been put into practical use. Among the above memory devices, a DRAM has a simple structure in which a memory cell includes a transistor and a capacitor and needs fewer semiconductor elements for forming a memory cell than other memory devices such as an SRAM. Therefore, memory capacity per unit area can be increased as compared to other memory devices, thereby realizing cost reduction.

As described above, a DRAM is suitable for large storage capacity, but memory capacity per unit area needs to be further increased as in other memory devices in order that an integrated circuit having higher degree of integration is realized while an increase in a chip size is suppressed. For that purpose, the area of a capacitor for holding electric charge provided in each memory cell has to be reduced and the area of each memory cell has to be reduced.

However, as the capacitance value is decreased due to reduction in the area of a capacitor, difference between the amounts of electric charge corresponding to different digital values becomes smaller. Thus, if the value of off-state current of the transistor is high, it is difficult to maintain the accuracy of data, and a holding period tends to be short. Accordingly, frequency of refresh operation is increased and power consumption is increased.

Further, when the number of memory cells is increased in order to achieve large storage capacity, the number of memory cells which are connected to one bit line is increased or a distance of one bit line which is led becomes longer. Thus, the parasitic capacitance and the parasitic resistance of the bit line are increased; therefore, the difference between the amounts of electric charge between digital values becomes smaller due to reduction in the area of the capacitor. As a result, it is difficult to read the above difference in the amount of electric charge; in other words, read data accurately through the bit line; thus, the incidence of error increases.

Furthermore, when the number of memory cells is increased, as in the case of the bit line, the number of memory cells which are connected to one word line is increased or a distance of one word line which is led becomes longer. Thus, the parasitic capacitance and the parasitic resistance of the word line are increased; therefore, the pulses of signals input to the word line are delayed or the potential drop of the word line becomes larger. As a result, when a signal for controlling switching of the transistor is supplied to a memory cell through a word line, malfunction in a series of operations such as data writing, holding, and reading occurs by the memory cell; for example, data is not written, data is lost because the data is not sufficiently held, or data is not read accurately because it takes so much time to read the data; thus, the incidence of error increases.

In view of the above problems, an object of one embodiment of the present invention is to propose a memory device in which a period in which data is held is ensured and memory capacity per unit area can be increased. In addition, another object of one embodiment of the present invention is to propose a memory device in which the incidence of error is reduced and memory capacity per unit area can be increased. Further, another object of one embodiment of the present invention is to realize a highly integrated semiconductor device with the use of the above memory device. Furthermore, another object of one embodiment of the present invention is to realize a highly reliable semiconductor device with the use of the above memory device.

The present inventors have considered that when the number of memory cells connected to one bit line is reduced and instead the number of bit lines is increased, the parasitic capacitance and the parasitic resistance of the bit line can be reduced even when the number of memory cells is increased. However, when the number of bit lines is increased, cell arrays each including a plurality of memory cells have a shape in which the layout thereof extends long in one direction, and the aspect ratio is far from 1.

When the aspect ratio of the cell array is far from 1, the versatility of the memory device becomes lower. Further, when an integrated circuit using the memory device is designed, the constraint on the layout becomes larger. Thus, in a memory device according to one embodiment of the present invention, a plurality of bit lines is divided into some groups, and a plurality of word lines is also divided into some groups. The word lines assigned to one group is connected to the memory cell connected to the bit lines assigned to one group. Further, the driving of the above plurality of bit lines is controlled in each group by a plurality of bit line driver circuits.

With the above structure, it becomes easier to design the layout of cell arrays so that the aspect ratio comes close to 1.

Further, in one embodiment of the present invention, cell arrays are formed on a driver circuit including the above plurality of bit line driver circuits and a word line driver circuit. The driver circuit and the cell arrays are overlapped with each other in a three-dimensional manner, so that an occupation area of the memory device can be made small even when the plurality of bit line driver circuits is provided.

Specifically, one embodiment of the present invention is a memory device including a first bit line driver circuit for driving a plurality of first bit lines; a second bit line driver circuit for driving a plurality of second bit lines; a word line driver circuit for driving a plurality of first word lines and a plurality of second word lines; and a first cell array having a plurality of first memory cells and a second cell array having a plurality of second memory cells. In the memory device, the first memory cell includes a first transistor in which a gate electrode is electrically connected to one of the plurality of first word lines, and one of a source electrode and a drain electrode is electrically connected to one of the plurality of first bit lines; and a first capacitor in which one of electrodes is electrically connected to the other of the source electrode and the drain electrode of the first transistor. In the memory device, the second memory cell includes a second transistor in which a gate electrode is electrically connected to one of the plurality of second word lines, and one of a source electrode and a drain electrode is electrically connected to one of the plurality of second bit lines; and a second capacitor in which one of electrodes is electrically connected to the other of the source electrode and the drain electrode of the second transistor. The first cell array is provided over the first bit line driver circuit so as to overlap with the first bit line driver circuit, and the second cell array is provided over the second bit line driver circuit so as to overlap with the second bit line driver circuit.

Additionally, in one embodiment of the present invention, a semiconductor such as silicon or germanium is used for a semiconductor element of a transistor or the like used for the driver circuit. Further, a semiconductor such as an oxide semiconductor, whose band gap is wider than that of the above silicon or germanium, is used for a transistor included in each of the memory cells of each cell array.

The off-state current of a transistor in which a semiconductor having a wide band gap, such as an oxide semiconductor, is used for an active layer is extremely low as compared to the off-state current of a transistor including a semiconductor such as silicon or germanium. Thus, leakage of electric charge from a capacitor can be prevented by using the above transistor whose off-state current is extremely low for the memory cells. Therefore, an increase in frequency of refresh operation can be prevented even when the size of the capacitor is reduced due to miniaturization of the memory cells.

In other words, the memory device in which the first transistor and the second transistor are each a transistor in which an oxide semiconductor is used for an active layer is also one embodiment of the present invention.

On the other hand, the mobility of a transistor in which a semiconductor such as polycrystalline silicon, singe crystal silicon, polycrystalline germanium, or single crystal germanium is used for an active layer is higher than the mobility of the transistor in which the semiconductor having a wide band gap is used for an active layer. Thus, the memory device can be driven at high speed by using the transistor having high mobility for the driver circuit.

In other words, the memory device in which the first bit line driver circuit, the second bit line driver circuit, and the word line driver circuit each include a transistor in which polycrystalline silicon, single crystal silicon, polycrystalline germanium, or single crystal germanium is used for an active layer is also one embodiment of the present invention.

A memory device according to one embodiment of the present invention can reduce the number of elements electrically connected to a bit line. In other words, parasitic capacitance of the bit line can be reduced. Further, the bit line can be shortened in accordance with the reduction in the number of elements electrically connected to the bit line. In other words, parasitic capacitance of the bit line can be reduced. Accordingly, data can be held in a memory cell even when the capacitance (the size) of the capacitor provided in the memory cell is reduced. Therefore, memory capacity per unit area can be increased. A memory device according to one embodiment of the present invention can reduce the incidence of error and increase memory capacity per unit area. Further, a semiconductor device according to one embodiment of the present invention can increase the intensity with the use of the above memory device and therefore can be miniaturized. Furthermore, the semiconductor device according to one embodiment of the present invention can improve the reliability with the use of the above memory device.

BRIEF DESCRIPTION OF THE DRAWINGS

FIGS. 14A to 14C illustrate a structure of an oxide material according to one embodiment of the present invention.

DETAILED DESCRIPTION OF THE INVENTION

Embodiments and examples of the present invention will be described below in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be construed as being limited to the description of embodiments and examples below.

Note that the present invention includes, in its category, all the semiconductor devices in which memory devices can be used: for example, integrated circuits such as microprocessors and image processing circuits, RF tags, memory media, and semiconductor display devices. Further, the semiconductor display devices include semiconductor display devices in which circuit elements using semiconductor films are included in pixel portions or driver circuits, such as liquid crystal display devices, light-emitting devices in which a light-emitting element typified by an organic light-emitting element (OLED) is provided for each pixel, electronic paper, digital micromirror devices (DMD), plasma display panels (PDP), and field emission displays (FED), in its category.

Embodiment 1

First, a memory device of one embodiment of the present invention will be described with reference to FIG. 1, FIG. 2, FIG. 3, FIG. 4, and FIG. 5.
<Structural Example of Memory Device>

Figure 1:
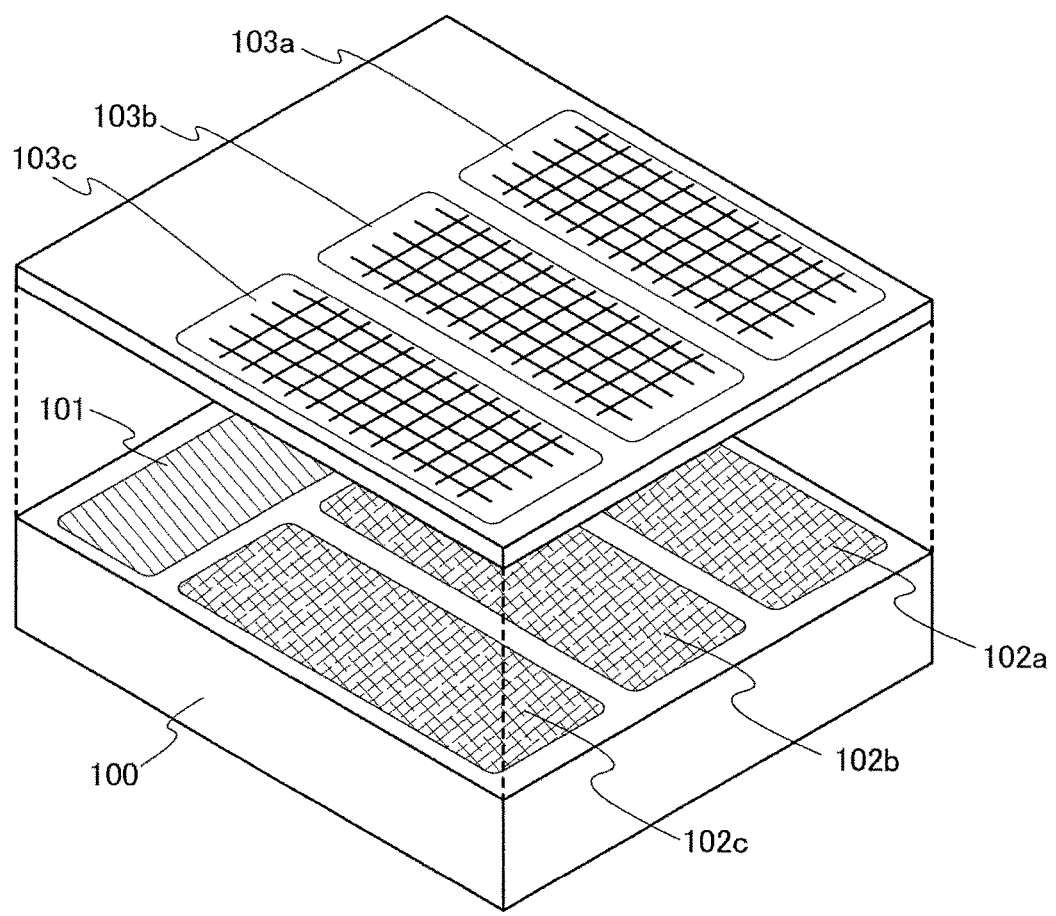
FIG. 1 is a conceptual diagram showing a structural example of a memory device.

FIG. 1 is a conceptual diagram showing a structural example of a memory device of one embodiment of the present invention. The memory device illustrated in FIG. 1 includes, with the use of a semiconductor substrate 100, a word line driver circuit 101; a first bit line driver circuit 102a, a second bit line driver circuit 102b, and a third bit line driver circuit 102c; and a first cell array 103a provided over the first bit line driver circuit 102a so as to overlap with the first bit line driver circuit 102a, a second cell array 103b provided over the second bit line driver circuit 102b so as to overlap with the first bit line driver circuit 102b, and a third cell array 103c provided over the third bit line driver circuit 102c so as to overlap with the first bit line driver circuit 102c. Note that in FIG. 1, a portion comprising the word line driver circuit 101, and the first bit line driver circuit 102a to the third bit line driver circuit 102c are illustrated separately from a portion comprising the first cell array 103a to the third cell array 103c; however, both portions are provided so as to be piled up in the memory device.

As the semiconductor substrate 100, a semiconductor substrate formed using an element belonging to Group 14 of the periodic table, such as silicon, germanium, silicon germanium, or silicon carbide; a compound semiconductor substrate such as a gallium arsenide substrate or an indium phosphide substrate; an SOI substrate; or the like can be used. Note that in general, the term "SOI substrate" means a substrate where a silicon layer is provided on an insulating surface. In this specification and the like, the term "SOI substrate" also means a substrate where a semiconductor layer including a material other than silicon is provided on an insulating surface. Moreover, the SOI substrate can be a substrate having a structure in which a semiconductor layer is provided over an insulating substrate such as a glass substrate, with an insulating layer interposed therebetween.

Note that in FIG. 1, three bit line driver circuits and three cell arrays are included in the memory device; however, the memory device can include k (k is a natural number of 2 or more) bit line driver circuits, and k cell arrays which are provided over the bit line driver circuits each corresponding to one of the k bit line driver circuits so as to overlap with the corresponding one of the k bit line driver circuits.
<Structural Example of Cell Array>

Figure 2:
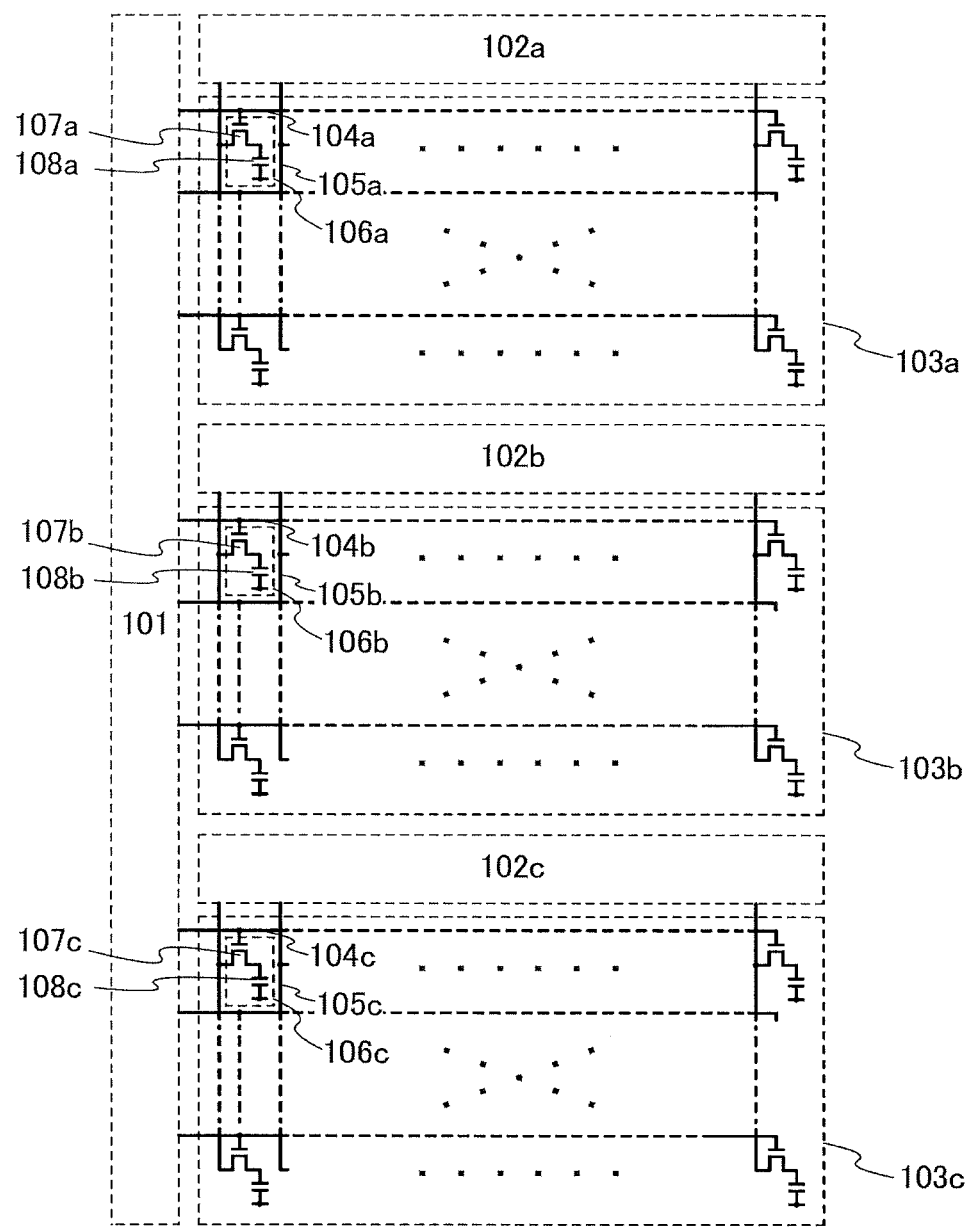
FIG. 2 is a circuit diagram showing a structural example of a cell array.

FIG. 2 is a circuit diagram showing a structural example of cell arrays (the first cell array 103a to the third cell array 103c). The first cell array 103a illustrated in FIG. 2 includes a plurality of first word lines 104a, a plurality of first bit lines 105a, and a plurality of first memory cells 106a provided in a matrix. Note that each of the plurality of first memory cells 106a includes a transistor 107a in which a gate electrode is electrically connected to one of the plurality of first word lines 104a, and one of a source electrode and a drain electrode is electrically connected to one of the plurality of first bit lines 105a; and a capacitor 108a in which one of electrodes is electrically connected to the other of the source electrode and the drain electrode of the transistor 107a, and the other of the electrodes is electrically connected to a capacitor line. In addition, the potential of each of the plurality of first word lines 104a is controlled by the word line driver circuit 101. In other words, the word line driver circuit 101 is a circuit for controlling switching of the transistor included in the first memory cell 106a. Further, the potential of each of the plurality of first bit lines 105a is controlled and judged by the first bit line driver circuit 102a. Concretely, when data is written in the specific first memory cell 106a, the potential of the first bit line 105a which is electrically connected to the specific first memory cell 106a is controlled by the first bit line driver circuit 102a so that a potential corresponding to the data is obtained; and when data is read from the specific first memory cell 106a, the potential of the first bit line 105a which is electrically connected to the specific first memory cell 106a is judged so that the data is read. In other words, the first bit line driver circuit 102a is a circuit for writing data to the first memory cell 106a and reading the data therefrom.

The second cell array 103b and the third cell array 103c illustrated in FIG. 2 have structures similar to that of the first cell array 103a in FIG. 2. Specifically, the second cell array 103b includes a plurality of second word lines 104b, a plurality of second bit lines 105b, and a plurality of second memory cells 106b which are provided in a matrix. Note that the second memory cell 106b has a circuit configuration similar to that of the first memory cell 106a. Specifically, each of the plurality of second memory cells 106b includes a transistor 107b in which a gate electrode is electrically connected to one of the plurality of second word lines 104b, and one of a source electrode and a drain electrode is electrically connected to one of the plurality of second bit lines 105b; and a capacitor 108b in which one of electrodes is electrically connected to the other of the source electrode and the drain electrode of the transistor 107b, and the other of the electrodes is electrically connected to a capacitor line. In addition, the potential of each of the plurality of second word lines 104b is controlled by the word line driver circuit 101. Further, the potential of each of the plurality of second bit lines 105b is controlled and judged by the second bit line driver circuit 102b.

Similarly, the third cell array 103c includes a plurality of third word lines 104c, a plurality of third bit lines 105c, and a plurality of third memory cells 106c which are provided in a matrix. Note that the third memory cell 106c has a circuit configuration similar to those of the first memory cell 106a and the second memory cell 106b. Specifically, each of the plurality of third memory cells 106c includes a transistor 107c in which a gate electrode is electrically connected to one of the plurality of third word lines 104c, and one of a source electrode and a drain electrode is electrically connected to one of the plurality of third bit lines 105c; and a capacitor 108c in which one of electrodes is electrically connected to the other of the source electrode and the drain electrode of the transistor 107c, and the other of the electrodes is electrically connected to a capacitor line. In addition, the potential of each of the plurality of third word lines 104c is controlled by the word line driver circuit 101. Further, the potential of each of the plurality of third bit lines 105c is controlled and judged by the third bit line driver circuit 102c.

<Structural Example of Driver Circuit>

Figure 3:
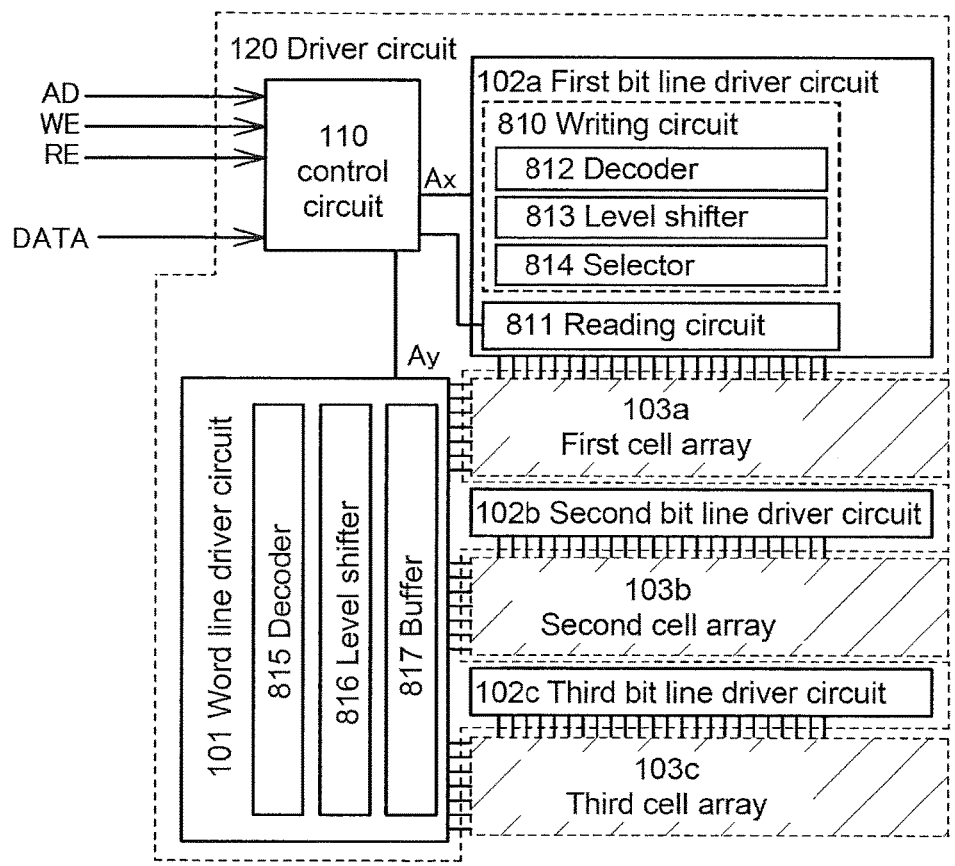
FIG. 3 is a block diagram showing a structural example of a driver circuit.

FIG. 3 is a block diagram showing a structural example of a driver circuit (the word line driver circuit 101, the first bit line driver circuit 102a to the third bit line driver circuit 102c, and the like). Note that in FIG. 3, circuits classified in accordance with their functions are illustrated as separated blocks. However, it is difficult to classify actual circuits according to their functions completely and it is possible for one circuit to have a plurality of functions.

The memory device illustrated in FIG. 3 includes the first cell array 103a, the second cell array 103b, and the third cell array 103c; and a driver circuit 120. The driver circuit 120 includes the word line driver circuit 101, and the first bit line driver circuit 102a to the third bit line driver circuit 102c. Further, the driver circuit 120 includes a control circuit 110 for controlling the operation of the word line driver circuit 101, and the first bit line driver circuit 102a to the third bit line driver circuit 102c.

Furthermore, the first bit line driver circuit 102a illustrated in FIG. 3 includes a writing circuit 810 for writing data to a selected memory cell of the first cell array 103a and a reading circuit 811 for generating a signal including data read from the first cell array 103a. The writing circuit 810 includes a decoder 812, a level shifter 813, and a selector 814.

Note that the second bit line driver circuit 102b and the third bit line driver circuit 102c have circuit configurations similar to that of the first bit line driver circuit 102a. Thus, for the specific circuit configurations of the second bit line driver circuit 102b and the third bit line driver circuit 102c, the above configuration of the first bit line driver circuit 102a can be referred to.

Further, the word line driver circuit 101 illustrated in FIG. 3 includes a decoder 815, a level shifter 816, and a buffer 817.

Next, a specific example of operation of the driver circuit illustrated in FIG. 3 will be shown.

When a signal AD including an address (Ax, Ay) is input to the control circuit 110 illustrated in FIG. 3, the control circuit 110 judges which of the cell arrays the memory cell of the above address belongs to, between the first cell array 103a, the second cell array 103b, and the third cell array 103c. When the above memory cell belongs to, for example, the first cell array 103a, the address Ax which is data on the column direction of the address is sent to the first bit line driver circuit 102a corresponding to the first cell array 103a. In addition, the control circuit 110 send a signal DATA including data to the above first bit line driver circuit 102a. Further, the address Ay which is data on the row direction of the address is sent to the word line driver circuit 101.

Operation of writing data and operation of reading data in the first cell array 103a to the third cell array 103c are selected in accordance with a signal RE (read enable), a signal WE (write enable), or the like supplied to the control circuit 110.

For example, in the first memory cell array 103a, when the writing operation is selected in accordance with the signal WE, a signal for selecting memory cells corresponding to the address Ay is generated in the decoder 815 included in the word line driver circuit 101 in response to an instruction from the control circuit 110. The amplitude of the signal is adjusted by the level shifter 816, and then the waveform of the signal is processed in the buffer 817 and the processed signal is input to the first cell array 103a through the first word line.

In the first bit line driver circuit 102a, a signal for selecting a memory cell corresponding to the address Ax among the memory cells selected in the decoder 812 is generated in response to an instruction from the control circuit 110. The amplitude of the signal is adjusted by the level shifter 813, and then the processed signal is input to the selector 814. In the selector 814, the signal DATA is sampled in accordance with the input signal, and the sampled signal is input to a memory cell corresponding to the address (Ax, Ay).

When the reading operation is selected in accordance with the signal RE, a signal for selecting memory cells corresponding to the address Ay is generated in the decoder 815 included in the word line driver circuit 101 in response to an instruction from the control circuit 110. The amplitude of the signal is adjusted by the level shifter 816, and then the waveform of the signal is processed in the buffer 817 and the processed signal is input to the first cell array 103a. In the reading circuit 811 included in the first bit line driver circuit 102a, a memory cell corresponding to the address Ax among the memory cells selected in the decoder 815 is selected in response to an instruction from the control circuit 110. In the reading circuit 811, data stored in the memory cell corresponding to the address (Ax, Ay) is read, and a signal including the data is generated.

Note that the memory device according to one embodiment of the present invention may be provided with a connection terminal which can be mounted on a printed wiring board or the like and may be protected with a resin or the like, that is, may be packaged.

Further, the control circuit 110 may be formed using one substrate together with other circuits included in the memory device (the word line driver circuit 101, the first bit line driver circuit 102a to the third bit line driver circuit 102c, and the first cell array 103a to the third cell array 103c), or the control circuit 110 and other circuits may be formed using different substrates.

In the case where different substrates are used, electrical connection can be ensured with the use of an FPC (flexible printed circuit) or the like. In that case, part of the control circuit 110 may be connected to an FPC by a COF (chip on film) method. Further, electrical connection can be ensured by a COG (chip on glass) method.

<Structural Example of Reading Circuit>

Next, a specific structural example of the reading circuit will be described.

The levels of potentials read from the cell array are determined in accordance with data written to the memory cells. Accordingly, ideally, potentials having the same level should be read from the plurality of memory cells when data with the same digital value is stored in the plurality of memory cells. However, practically, there is a case where the characteristics of transistors functioning as capacitors or transistors which function as switching elements vary among the memory cells. In that case, the potentials actually read vary even when all the data to be read have the same digital value, so that the levels of the potentials can be widely distributed. However, a reading circuit in which a signal including more accurate data and having an amplitude and a waveform processed in accordance with a desired specification can be generated even when potentials read from the cell array vary slightly.

Figure 4:
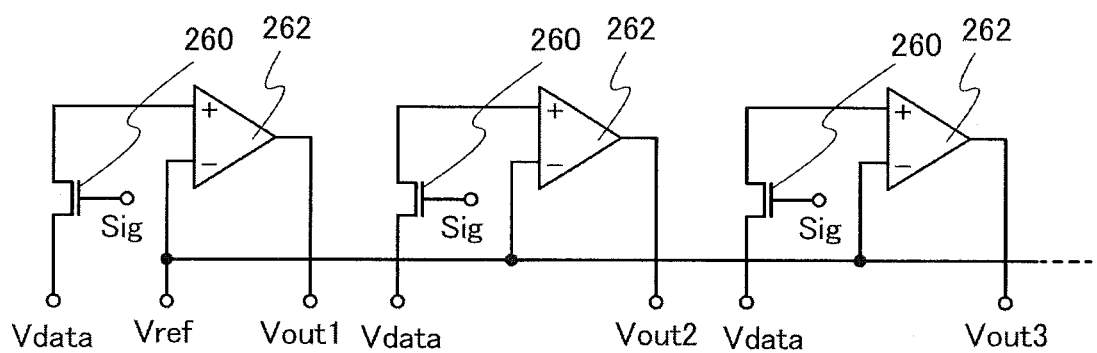
FIG. 4 is a circuit diagram showing a structural example of a reading circuit.

FIG. 4 is a circuit diagram showing a structural example of the reading circuit. The reading circuit illustrated in FIG. 4 includes transistors 260 which function as switching elements for controlling the input of potentials Vdata read from a cell array by the reading circuit. The reading circuit illustrated in FIG. 4 further includes operational amplifiers 262.

The transistor 260 which functions as a switching element controls the supply of a potential Vdata to a non-inverting input terminal (+) of the operational amplifier 262 in accordance with a potential of a signal Sig applied to a gate electrode of the transistor 260. For example, when the transistor 260 is turned on, the potential Vdata is applied to the non-inverting input terminal (+) of the operational amplifier 262. In contrast, a reference potential Vref is supplied to inverting input terminals (−) of the operational amplifiers 262. The levels of potentials Vout of output terminals can be changed depending on the level of the potential applied to the non-inverting input terminals (+) with respect to the reference potential Vref. Thus, a signal which indirectly includes data can be obtained.

Note that even if data with the same value is stored in memory cells, fluctuation in levels of the read potential Vdata occurs due to variation in characteristics of the memory cells, so that the levels of potentials might be widely distributed. Thus, the level of the reference potential Vref is determined in consideration of fluctuation in the potential Vdata in order to read the value of data accurately.

Since FIG. 4 shows an example of a reading circuit at the time when a binary digital value is used, one operational amplifier used for reading data is used for one node to which the potential Vdata is applied. However, the number of operational amplifiers is not limited thereto. When n-valued data (n is a natural number of 2 or more) is used, the number of operational amplifiers used for one node to which the potential Vdata is applied is (n−1).

<Example of Cross-Sectional Structure of Memory Device>

Figure 5:
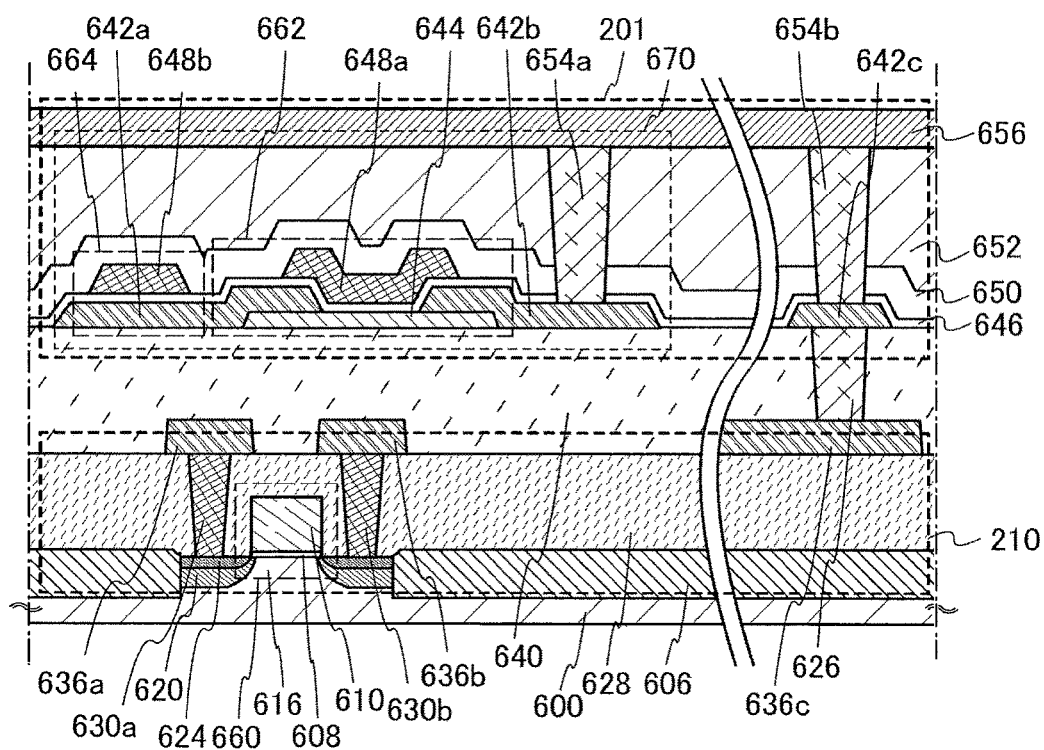
FIG. 5 is a cross-sectional view showing a structural example of a memory device.

FIG. 5 is a cross-sectional view showing a structural example of a memory device. The memory device illustrated in FIG. 5 includes a cell array 201 provided with a plurality of memory cells 670 in an upper portion and a driver circuit 210 in a lower portion. The cell array 201 in the upper portion includes a transistor 662 including an oxide semiconductor, and the driver circuit 210 in the lower portion includes a transistor 660 including a semiconductor such as polycrystalline silicon, single crystal silicon, polycrystalline germanium, or single crystal germanium.

Either an n-channel transistor or a p-channel transistor can be employed as the transistor 660 and the transistor 662. Here, the case where the transistor 660 and the transistor 662 are both n-channel transistors will be described below as an example.

The transistor 660 includes a channel formation region 616 provided in a substrate 600 including a semiconductor such as silicon or germanium, impurity regions 620 between which the channel formation region 616 is provided, metal compound regions 624 in contact with the impurity regions 620, a gate insulating film 608 provided over the channel formation region 616, a gate electrode 610 provided over the gate insulating film 608, and a source or drain electrode 630a and a source or drain electrode 630b which are electrically connected to the metal compound regions 624. In addition, an insulating film 628 is provided to cover the transistor 660. The source or drain electrode 630a and the source or drain electrode 630b are electrically connected to the metal compound regions 624 through openings formed in the insulating film 628. In addition, an electrode 636a and an electrode 636b are provided over the insulating film 628 in contact with the source or drain electrode 630a and the source or drain electrode 630b, respectively.

Over the substrate 600, an element isolation insulating layer 606 is provided so as to surround the transistor 660. For high integration, as illustrated in FIG. 5, it is preferable that the transistor 660 do not include a sidewall insulating film. On the other hand, when the importance is put on the characteristics of the transistor 660, a sidewall insulating film may be provided on a side surface of the gate electrode 610 and the impurity regions 620 may include an impurity region having a different impurity concentration provided in a region overlapping with the sidewall insulating film.

The transistor 662 includes, over an insulating film 640 which covers the electrode 636a and the electrode 636b, an oxide semiconductor film 644; a source or drain electrode 642a and a source or drain electrode 642b electrically connected to the oxide semiconductor film 644; a gate insulating film 646 which covers the oxide semiconductor film 644, the source or drain electrode 642a, the source or drain electrode 642b; and a gate electrode 648a which is provided over the gate insulating film 646 so as to overlap with the oxide semiconductor film 644.

The concentration of hydrogen in the oxide semiconductor film 644 that is measured by secondary ion mass spectrometry (SIMS) is lower than or equal to $5 \times 10^{19}/\text{cm}^3$, preferably lower than or equal to $5 \times 10^{18}/\text{cm}^3$, more preferably lower than or equal to $5 \times 10^{17}/\text{cm}^3$ or lower, or still more preferably lower than or equal to $1\times10^{16}/cm^3$ or lower. In addition, the carrier density of the oxide semiconductor film that can be measured by Hall effect measurement is lower than $1\times10^{14}/cm^3$, preferably lower than $1\times10^{12}/cm^3$, or more preferably lower than $1\times10^{11}/cm^3$. Further, the band gap of the oxide semiconductor is greater than or equal to 2 eV, preferably greater than or equal to 2.5 eV, or more preferably greater than or equal to 3 eV. With the use of an oxide semiconductor film which is highly purified by a sufficient decrease in the concentration of impurities such as moisture or hydrogen, the off-state current of the transistor 662 can be reduced.

The analysis of the concentration of hydrogen in the oxide semiconductor film is described here. The concentration of hydrogen in the oxide semiconductor film and a conductive film is measured by secondary ion mass spectrometry (SIMS). It is known that it is difficult to accurately obtain data in the proximity of a surface of a sample or in the proximity of an interface between stacked films formed using different materials by the SIMS analysis in principle. Thus, in the case where the distribution of the concentration of hydrogen in the film in a thickness direction is analyzed by SIMS, an average value in a region of the film in which the value is not greatly changed and substantially the same value can be obtained is employed as the hydrogen concentration. Further, in the case where the thickness of the film is small, a region where almost the same value can be obtained cannot be found in some cases due to the influence of the hydrogen concentration of the films adjacent to each other. In that case, the maximum value or the minimum value of the concentration of hydrogen in the region of the film is employed as the hydrogen concentration of the film. Further, in the case where a mountain-shaped peak having the maximum value or a valley-shaped peak having the minimum value do not exist in the region of the film, the value at the inflection point is employed as the hydrogen concentration.

Specifically, various experiments can prove low off-state current of a transistor including a highly-purified oxide semiconductor film as an active layer. For example, even when an element has a channel width of $1\times10^6$ µm and a channel length of 10 µm, off-state current can be lower than or equal to the measurement limit of a semiconductor parameter analyzer, i.e., lower than or equal to $1\times10^{-13}$ A, at a voltage (drain voltage) between a source electrode and a drain electrode of 1 to 10 V. In that case, it can be seen that off-state current density corresponding to a value obtained by division of the off-state current by the channel width of the transistor is lower than or equal to 100 zA/µm. In addition, a capacitor and a transistor were connected to each other and off-state current density was measured using a circuit in which electric charge flowing to or from the capacitor was controlled by the transistor. In the measurement, the highly-purified oxide semiconductor film was used as a channel formation region in the transistor, and the off-state current density of the transistor was measured from change in the amount of electric charge of the capacitor per unit time. As a result, it was found that, in the case where the voltage between the source electrode and the drain electrode of the transistor was 3 V, a lower off-state current density of several tens yoctoampere per micrometer (yA/µm) was obtained. Thus, in a semiconductor device according to one embodiment of the present invention, the off-state current density of the transistor including the highly-purified oxide semiconductor film as an active layer can be lower than or equal to 100 yA/µm, preferably lower than or equal to 10 yA/µm, or more preferably lower than or equal to 1 yA/µm depending on the voltage between the source electrode and the drain electrode. Accordingly, the transistor including the highly-purified oxide semiconductor film as an active layer has much lower off-state current than a transistor including crystalline silicon.

Note that although the transistor 662 includes the oxide semiconductor film which is processed into an island shape in order to suppress leakage current between elements which is caused due to miniaturization, the oxide semiconductor film which is not processed into an island shape may be employed. In the case where the oxide semiconductor film is not processed into an island shape, the number of masks can be reduced.

A capacitor 664 includes the source or drain electrode 642a, the gate insulating film 646, and a conductive film 648b. In other words, the source or drain electrode 642a functions as one of electrodes of the capacitor 664, and the conductive film 648b functions as the other of the electrodes of the capacitor 664. With such a structure, sufficient capacitance can be ensured.

Note that in the transistor 662 and the capacitor 664, end portions of the source or drain electrode 642a and the source or drain electrode 642b are preferably tapered. When the end portions of the source or drain electrode 642a and the source or drain electrode 642b are tapered, the coverage with the gate insulating film 646 can be improved and disconnection of the gate insulating film 646 in the above end portions can be prevented. Here, a taper angle is, for example, greater than or equal to 30° and less than or equal to 60°. Note that the taper angle is a tilt angle formed by a side surface and a bottom surface of a film having a tapered shape (e.g., the source or drain electrode 642a) in the case where the film is observed from a direction perpendicular to a cross section (a plane perpendicular to the surface of a substrate).

An insulating film 650 and an insulating film 652 are provided over the transistor 662 and the capacitor 664. An electrode 654a and an electrode 654b are provided in an opening formed in the gate insulating film 646, the insulating film 650, the insulating film 652, and the like, and a wiring 656 is formed over the insulating film 652 to be connected to the electrode 654a and the electrode 654b. The wiring 656 is a wiring for connecting one memory cell and another memory cell. The wiring 656 is connected to an electrode 636c through the electrode 654b, an electrode 642c, and an electrode 626. With the above structure, the driver circuit 210 in the lower portion and the cell array 201 in the upper portion can be connected. Note that although, in FIG. 5, the electrode 642c is electrically connected to the electrode 636c through the electrode 626, the electrode 642c and the electrode 636c may be in direct contact with each other by forming an opening in the insulating film 640.

Note that although, in FIG. 5, an example in which one layer of the cell array 201 is stacked over the driver circuit 210 is shown, one embodiment of the present invention is not limited thereto and two or more layers of the cell array may be stacked. In other words, the cell array 201 can be formed using a plurality of cell array layers. Note that a second cell array layer is provided over a first cell array layer. The same is applied to cell array layers of three or more layers. Further, a structure similar to that of the first cell array layer can be applied to the cell array layers of two or more layers. Note that a structure different from that of the first cell array layer can also be applied to the cell array layers of two or more layers. With such a stacked structure, still higher integration of the memory device can be achieved.

<Memory Device Disclosed in this Specification>

In the memory device disclosed in this specification, the number of memory cells connected to one bit line can be reduced even when the number of memory cells is increased by increasing the number of bit lines. Thus, the parasitic capacitance and the parasitic resistance of the bit line can be reduced; therefore, data which is read through the bit line can be more precise even when the difference in the amount of electric charge between digital values becomes smaller due to reduction in the area of the capacitor. Thus, the incidence of error can be reduced.

Further, in the memory device disclosed in this specification, a plurality of bit lines is divided into some groups, and the driving of the bit lines is controlled in each group by a plurality of bit line driver circuit. With the above structure, the aspect ratio of the cell array can be prevented from being far from 1 even when the number of bit lines is increased. Thus, the versatility of the memory device can be increased. Further, when an integrated circuit using the memory device is designed, the constraint on the layout can be eased.

Furthermore, in the memory device disclosed in this specification, a plurality of word lines is divided into some groups, and the word line assigned to one group is connected to the memory cell connected to the bit line assigned to one group. With the above structure, the number of memory cells connected to one word line can be reduced even when the number of memory cells is increased. Thus, the parasitic capacitance and the parasitic resistance of the word line are reduced; therefore, delay of the pulses of signals input to the word line or an increase in the potential drop of the word line can be prevented; accordingly, the incidence of error in the memory device can be reduced.

In addition, in the memory device disclosed in this specification, a transistor whose off-state current is extremely low is used as a switching element for holding electric charge accumulated in a capacitor, whereby leakage of electric charge from the capacitor can be prevented. Thus, data can be held for a long time, and an increase in frequency of refresh operation can be prevented even when the capacitance value of the capacitor becomes smaller due to miniaturization of the memory cells.

Further, in the memory device disclosed in this specification, the driver circuit and the cell array are overlapped with each other in a three-dimensional manner, so that an occupation area of the memory device can be made small even when a plurality of bit line driver circuits is provided.

<Variations of Transistor>

Structural examples of a transistor which is different from the transistor 662 illustrated in FIG. 5 will be shown in FIGS. 6A and 6B and FIGS. 7A to 7D.

Figure 6A:
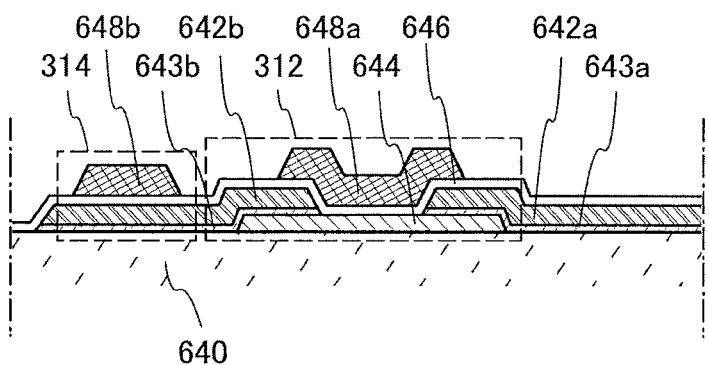
FIGS. 6A and 6B are cross-sectional views showing variation examples of a transistor.

In a transistor 312 illustrated in FIG. 6A, an oxide conductive film 643*a* and an oxide conductive film 643*b* which each function as a source region or a drain region are provided between an oxide semiconductor film 644, and a source or drain electrode 642*a* and a source or drain electrode 642*b*. When the oxide conductive film 643*a* and the oxide conductive film 643*b* which each function as a source region or a drain region are provided between the oxide semiconductor film 644, and the source or drain electrode 642*a* and the source or drain electrode 642*b*, the source region and the drain region can have lower resistance and the transistor 312 can operate at high speed. Further, when the oxide semiconductor film 644, the oxide conductive film 643*a*, the oxide conductive film 643*b*, the source or drain electrode 642*a*, and the source or drain electrode 642*b* are stacked, the withstand voltage of the transistor 312 can be improved. Furthermore, a capacitor 314 includes the oxide conductive film 643*b*, the source or drain electrode 642*b*, a gate insulating film 646, and a conductive film 648*b*.

Figure 6B:
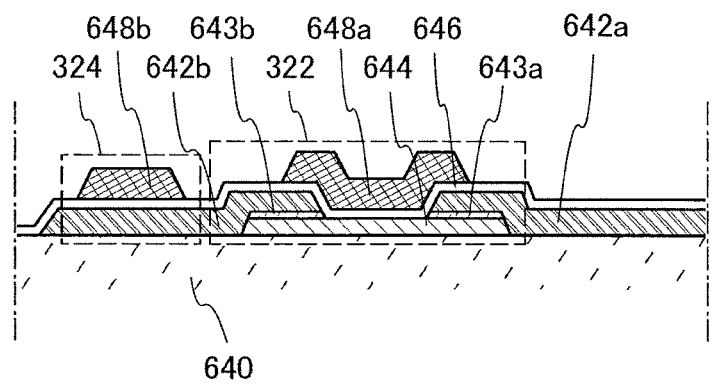

A transistor 322 illustrated in FIG. 6B is common to the transistor 312 in FIG. 6A in that an oxide conductive film 643*a* and an oxide conductive film 643*b* which each function as a source region or a drain region are provided between an oxide semiconductor film 644, and a source or drain electrode 642*a* and a source or drain electrode 642*b*. In the transistor 312 illustrated in FIG. 6A, the oxide conductive film 643*a* and the oxide conductive film 643*b* are in contact with the top surface and the side surfaces of the oxide semiconductor film 644, while in the transistor 322 illustrated in FIG. 6B, the oxide conductive film 643*a* and the oxide conductive film 643*b* are in contact with the top surface of the oxide semiconductor film 644. Even with such a structure, the source region and the drain region can have lower resistance and the transistor 322 can operate at high speed. Further, when the oxide semiconductor film 644, the oxide conductive film 643*a*, the oxide conductive film 643*b*, the source or drain electrode 642*a*, and the source or drain electrode 642*b* are stacked, the withstand voltage of the transistor 322 can be improved. Note that for the structure of a capacitor 324, the description of FIG. 5 can be referred to.

Figure 7A:
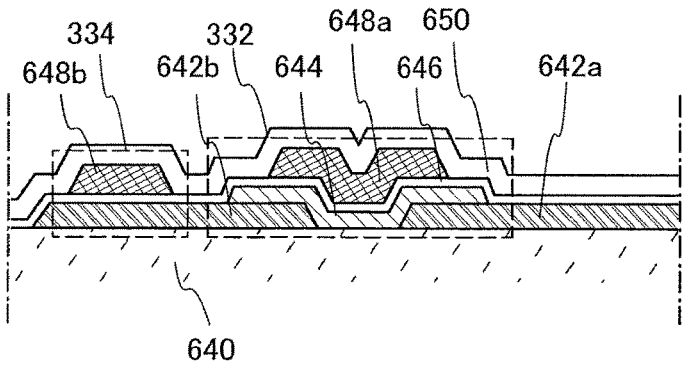
FIGS. 7A to 7D are cross-sectional views showing variation examples of a transistor.

A transistor 332 illustrated in FIG. 7A is common to the transistor 662 illustrated in FIG. 5 in that a source or drain electrode 642*a*, a source or drain electrode 642*b*, an oxide semiconductor film 644, a gate insulating film 646, and a gate electrode 648*a* are formed over an insulating film 640. The transistor 332 illustrated in FIG. 7A and the transistor 662 illustrated in FIG. 5 differ in a position where the oxide semiconductor film 644, the source or drain electrode 642*a*, and the source or drain electrode 642*b* are connected. In other words, in the transistor 662, the top surface of the oxide semiconductor film 644 is at least partly in contact with the source or drain electrode 642*a* and the source or drain electrode 642*b* by forming the source or drain electrode 642*a* and the source or drain electrode 642*b* after the oxide semiconductor film 644 is formed. On the other hand, in the transistor 332, the top surfaces of the source or drain electrode 642*a* and the source or drain electrode 642*b* are partly in contact with the oxide semiconductor film 644. Note that for the structure of a capacitor 334, the description of FIG. 5 can be referred to.

Although the top-gate transistors are illustrated in FIG. 5, FIGS. 6A and 6B, and FIG. 7A, a bottom-gate transistor may be employed. Bottom-gate transistors are illustrated in FIGS. 7B and 7C.

Figure 7B:
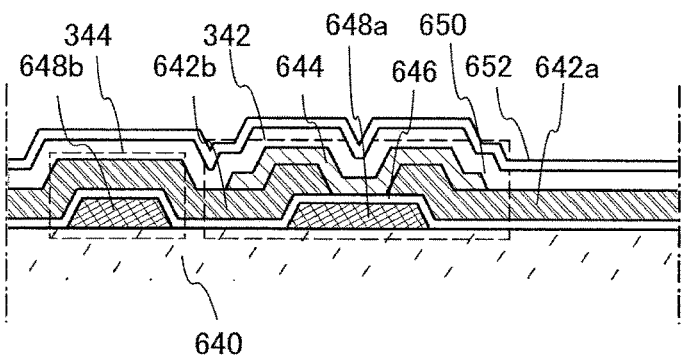

In a transistor 342 illustrated in FIG. 7B, a gate electrode 648*a* is provided over an insulating film 640; a gate insulating film 646 is provided over the gate electrode 648*a*; a source or drain electrode 642*a* and a source or drain electrode 642*b* are provided over the gate insulating film 646; and an oxide semiconductor film 644 is provided over the gate insulating film 646, the source or drain electrode 642*a*, and the source or drain electrode 642*b* so as to overlap with the gate electrode 648*a*. Further, a capacitor 344 includes a conductive film 648*b* provided over the insulating film 640, the gate insulating film 646, and the source or drain electrode 642*b*.

Furthermore, an insulating film 650 and an insulating film 652 may be provided over the transistor 342 and the capacitor 344.

Figure 7C:
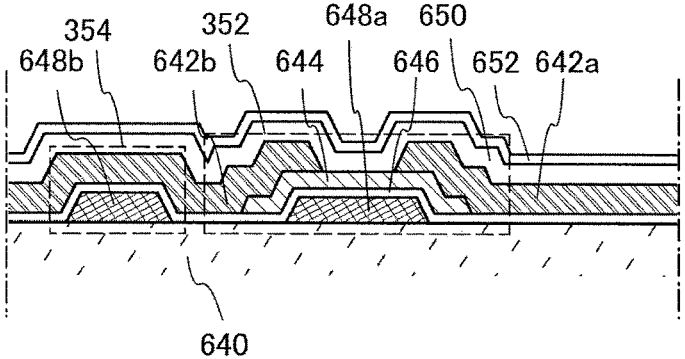

A transistor 352 illustrated in FIG. 7C is common to the transistor 342 illustrated in FIG. 7B in that a gate electrode 648*a*, a gate insulating film 646, a source or drain electrode 642*a*, a source or drain electrode 642*b*, and an oxide semiconductor film 644 are formed over an insulating film

640. The transistor 352 illustrated in FIG. 7C and the transistor 342 illustrated in FIG. 7B differ in a position where the oxide semiconductor film 644, the source or drain electrode 642a, and a source or drain electrode 642b are in contact with each other. In other words, in the transistor 342, the bottom surface of the oxide semiconductor film 644 is at least partly in contact with the source or drain electrode 642a and the source or drain electrode 642b by forming the oxide semiconductor film 644 after the source or drain electrode 642a and the source or drain electrode 642b are formed. On the other hand, in the transistor 352, the bottom surfaces of the source or drain electrode 642a and the source or drain electrode 642b are partly in contact with the oxide semiconductor film 644. Note that for the structure of a capacitor 354, the description of FIG. 7B can be referred to.

Further, a transistor may have a dual-gate structure including two gate electrodes positioned above and below a channel forming region with gate insulating films interposed therebetween. A dual-gate transistor is illustrated in FIG. 7D.

Figure 7D:
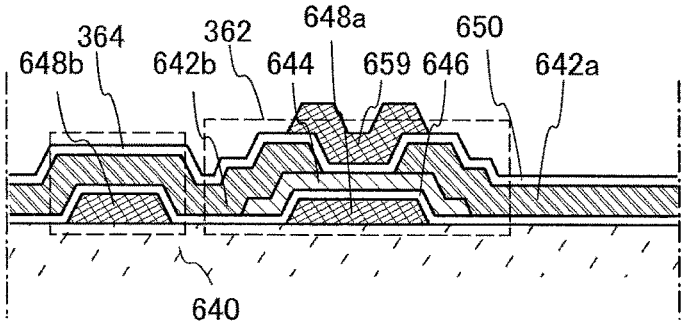

A transistor 362 illustrated in FIG. 7D is common to the transistor 342 illustrated in FIG. 7B in that a gate electrode 648a, a gate insulating film 646, a source or drain electrode 642a, a source or drain electrode 642b, and an oxide semiconductor film 644 are formed over an insulating film 640. In FIG. 7D, further, an insulating film 650 is provided so as to cover the source or drain electrode 642a, the source or drain electrode 642b, and the oxide semiconductor film 644; and a conductive film 659 is provided over the insulating film 650 so as to overlap with the oxide semiconductor film 644. The insulating film 650 functions as a second gate insulating film, and the conductive film 659 functions as a second gate electrode. With such a structure, in a bias-temperature stress test (hereinafter referred to as a BT test) for examining reliability of a transistor, the amount of change in threshold voltage of the transistor between before and after the BT test can be reduced. Note that the potential of the conductive film 659 may be the same as or different from that of the gate electrode 648a. Alternatively, the potential of the conductive film 659 may be GND or 0 V, or the conductive film 659 may be in a floating state.

<Example of Method for Manufacturing Transistor>

Next, an example of a method for manufacturing the transistor 662 illustrated in FIG. 5 will be described with reference to FIGS. 8A to 8D.

Figure 8A:
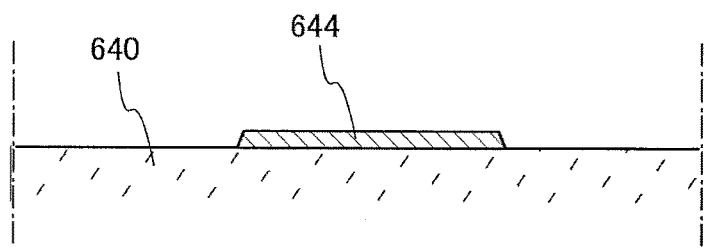
FIGS. 8A to 8D are cross-sectional views each showing an example of a method for manufacturing a transistor.

First, an oxide semiconductor film is formed over the insulating film 640, and the oxide semiconductor film is processed into the oxide semiconductor film 644 (see FIG. 8A).

The insulating film 640 is formed using a material including an inorganic insulating material such as silicon oxide, silicon oxynitride, silicon nitride oxide, silicon nitride, or aluminum oxide. It is preferable to use a low dielectric constant (low-k) material for the insulating film 640 because capacitance due to overlap of electrodes or wirings can be sufficiently reduced. Note that a porous insulating layer formed using such a material may be used as the insulating film 640. Since the porous insulating layer has low dielectric constant as compared to a dense insulating layer, capacitance due to electrodes or wirings can be further reduced. Alternatively, the insulating film 640 can be formed using an organic insulating material such as polyimide or acrylic. The insulating film 640 can be formed to have a single-layer structure or a stacked-layer structure using any of the above materials. Here, the case in which silicon oxide is used for the insulating film 640 is described.

Note that an oxide semiconductor to be used preferably contains at least indium (In) or zinc (Zn). In particular, In and Zn are preferably contained. As a stabilizer for reducing variation in electric characteristics of a transistor including the oxide semiconductor, it is preferable that gallium (Ga) be additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, or a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$, (m>0 is satisfied, and in is not an integer) may be used as an oxide semiconductor. Note that M represents one or more metal elements selected from Ga, Fe, Mn, and Co. Alternatively, as the oxide semiconductor, a material represented by a chemical formula, $In_3SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions is preferably used.

However, the composition is not limited to those described above, and a material having the appropriate composition may be used depending on needed semiconductor characteristics (e.g., mobility, threshold voltage, and variation). In order to obtain needed semiconductor characteristics, it is preferable that the carrier concentration, the impurity concentration, the defect density, the atomic ratio of a metal element to oxygen, the interatomic distance, the density, and the like be set to appropriate values.

For example, high mobility can be obtained relatively easily in the case where the In—Sn—Zn-based oxide is used. However, the mobility can be increased by reducing the defect density in the bulk also in the case where the In—Ga—Zn-based oxide is used.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In a crystalline oxide semiconductor, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, or more preferably less than or equal to 0.1 nm.

Note that the average surface roughness (Ra) is obtained by expanding, into three dimensions, center line average roughness that is defined by JIS B 0601 so as to be able to apply it to a measurement surface. The Ra can be expressed as an "average value of the absolute values of deviations from a reference surface to a designated surface" and is defined by the following formula.

[FORMULA 1]

$$Ra = \frac{1}{S_0} \int_{y_1}^{y_2} \int_{x_1}^{x_2} |f(x, y) - Z_0| dx dy \qquad (1)$$

In the above formula, $S_0$ represents the area of a measurement surface (a rectangular region which is defined by four points represented by coordinates $(x_1, y_1)$, $(x_1, y_2)$, $(x_2, y_1)$, and $(x_2, y_2)$), and $Z_0$ represents an average height of the measurement surface. Ra can be measured using an atomic force microscope (AFM).

It is preferable to form the oxide semiconductor film by a method in which impurities such as hydrogen, water, a hydroxyl group, or hydride do not easily enter the oxide semiconductor film. The oxide semiconductor film can be formed by a sputtering method or the like, for example.

Here, the oxide semiconductor film is formed by a sputtering method using an In—Ga—Zn-based oxide target.

As the In—Ga—Zn-based oxide target, for example, an oxide target having a composition ratio of $In_2O_3:Ga_2O_3:ZnO=1:1:1$ [molar ratio] can be used. Note that the material and the composition of the target are not necessarily limited to the above. For example, an oxide target having a composition ratio of $In_2O_3:Ga_2O_3:ZnO=1:1:2$ [molar ratio] can also be used.

The filling rate of the oxide target is higher than or equal to 90% and lower than or equal to 100%, preferably, higher than or equal to 95% and lower than or equal to 99.9%. With the use of the metal oxide target with a high filling rate, a dense oxide semiconductor film can be formed.

The film formation atmosphere may be a rare gas (typically argon) atmosphere, an oxygen atmosphere, or a mixed atmosphere containing a rare gas and oxygen. Further, it is preferable to employ an atmosphere using a high-purity gas in which impurities such as hydrogen, water, a hydroxyl group, or hydride are sufficiently removed because entry of hydrogen, water, a hydroxyl group, and hydride into the oxide semiconductor film can be prevented.

For example, the oxide semiconductor film can be formed as follows.

First, the substrate is held in a film formation chamber which is kept under reduced pressure, and then is heated so that the substrate temperature reaches a temperature higher than 200° C. and lower than or equal to 500° C., preferably higher than 300° C. and lower than or equal to 500° C., or more preferably higher than or equal to 350° C. and lower than or equal to 450° C.

Then, a high-purity gas from which impurities such as hydrogen, water, a hydroxyl group, or hydride are sufficiently removed is introduced while moisture remaining in the film formation chamber is removed, and the oxide semiconductor film is formed over the substrate with the use of the above target. In order to remove moisture remaining in the film formation chamber, an entrapment vacuum pump such as a cryopump, an ion pump, or a titanium sublimation pump is preferably used as an evacuation unit. Further, an evacuation unit may be a turbo pump provided with a cold trap. In the film formation chamber which is evacuated with the cryopump, for example, impurities such as hydrogen, water, a hydroxyl group, or hydride (preferably, also a compound including a carbon atom) or the like are removed, whereby the concentration of impurities such as hydrogen, water, a hydroxyl group, or hydride in the oxide semiconductor film formed in the film formation chamber can be reduced.

In the case where the substrate temperature is low (for example, 100° C. or lower) during film formation, a substance including a hydrogen atom may enter the oxide semiconductor; thus, it is preferable that the substrate be heated at a temperature in the above range. When the oxide semiconductor film is formed with the substrate heated at the above temperature, the substrate temperature is increased; thus, hydrogen bonds are cut due to heat and the substance including a hydrogen atom is less likely to be taken into the oxide semiconductor film. Therefore, by forming the oxide semiconductor film with the substrate heated at the above temperature, the concentration of impurities such as hydrogen, water, a hydroxyl group, or a hydride in the oxide semiconductor film can be sufficiently reduced. Further, damage due to sputtering can be reduced.

As an example of the film formation conditions, the following conditions can be employed: the distance between the substrate and the target is 60 mm; the pressure is 0.4 Pa; the direct-current (DC) power source is 0.5 kW; the substrate temperature is 400° C.; and the film formation atmosphere is an oxygen atmosphere (the proportion of the oxygen flow rate is 100%). Note that a pulse direct current power source is preferable because powder substances (also referred to as particles or dust) generated in film formation can be reduced and the film thickness can be uniform.

Note that before the oxide semiconductor film is formed by a sputtering method, powdery substances (also referred to as particles or dust) attached on a formation surface of the oxide semiconductor film are preferably removed by reverse sputtering in which an argon gas is introduced and plasma is generated. The reverse sputtering refers to a method in which voltage is applied to a substrate side to generate plasma in the vicinity of the substrate to modify a surface. Note that instead of argon, a gas such as nitrogen, helium, oxygen or the like may be used.

Next, the oxide semiconductor film is processed, whereby the oxide semiconductor film 644 is formed. The oxide semiconductor film can be processed by being etched after a mask having a desired shape is formed over the oxide semiconductor film. The mask may be formed by a method such as photolithography. Alternatively, a method such as an ink-jet method may be used to form the mask. For the etching of the oxide semiconductor film, either wet etching or dry etching may be employed. It is needless to say that both of them may be employed in combination.

After that, heat treatment (first heat treatment) may be performed on the oxide semiconductor film 644. The heat treatment removes a substance including a hydrogen atom included in the oxide semiconductor film 644; thus, a structure of the oxide semiconductor film 644 can be improved and defect levels in energy gap can be reduced. The heat treatment is performed under an inert gas atmosphere at higher than or equal to 250° C. and lower than or equal to 700° C., preferably higher than or equal to 450° C. and lower than or equal to 600° C. or lower than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is higher than or equal to 6 N (99.9999%), preferably higher than or equal to 7 N (99.99999%) (that is, the concentration of the impurities is lower than or equal to 1 ppm, preferably lower than or equal to 0.1 ppm).

The heat treatment can be performed in such a manner that, for example, an object to be heated is introduced into an electric furnace in which a resistance heating element or the like is used and heated, under a nitrogen atmosphere at 450° C. for 1 hour. During the heat treatment, the oxide semiconductor film 644 is not exposed to the air to prevent the entry of water or hydrogen.

The impurities are reduced by the heat treatment, leading to an i-type oxide semiconductor film (an intrinsic oxide semiconductor film) or a substantially i-type oxide semiconductor film. Accordingly, a transistor having extremely excellent characteristics can be realized.

Note that the above heat treatment has an advantageous effect of removing hydrogen, water, and the like and can be referred to as dehydration treatment, dehydrogenation treatment, or the like. The heat treatment can be performed at the timing, for example, before the oxide semiconductor film is processed to have an island shape or after the gate insulating film is formed. Such dehydration treatment or dehydrogenation treatment may be performed once or plural times.

Note that it has been pointed out that an oxide semiconductor is insensitive to impurities, there is no problem even when a considerable amount of metal impurities is contained in the film, and therefore soda-lime glass which contains a large amount of alkali metal such as sodium and is inexpensive can also be used (Kamiya, Nomura, and Hosono, "Engineering application of solid state physics: Carrier transport properties and electronic structures of amorphous oxide semiconductors: the present status", *KOTAI BUTSURI (SOLID STATE PHYSICS)*, 2009, Vol. 44, pp. 621-633). But such consideration is not appropriate. Alkali metal is not an element included in an oxide semiconductor and therefore is an impurity. Also, alkaline earth metal is impurity in the case where alkaline earth metal is not included in an oxide semiconductor. Alkali metal, in particular, Na becomes Na$^\square$ when an insulating film which is in contact with the oxide semiconductor film is an oxide and Na diffuses into the insulating film. In addition, in the oxide semiconductor film, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the concentration of hydrogen in the oxide semiconductor film is very low. Therefore, when the concentration of hydrogen in the oxide semiconductor film is lower than or equal to $5\times10^{19}$ cm$^{-3}$, especially lower than or equal to $5\times10^{18}$ cm$^{-3}$, the concentration of the above impurity is preferably reduced. Specifically, a measurement value of a Na concentration by secondary ion mass spectrometry is preferably lower than or equal to $5\times10^{16}$/cm$^3$, more preferably lower than or equal to $1\times10^{16}$/cm$^3$, or still more preferably lower than or equal to $1\times10^{15}$/cm$^3$. In a similar manner, a measurement value of a Li concentration is preferably lower than or equal to $5\times10^{15}$/cm$^3$, more preferably lower than or equal to $1\times10^{15}$/cm$^3$. In a similar manner, a measurement value of a K concentration is preferably lower than or equal to $5\times10^{15}$/cm$^3$, more preferably lower than or equal to $1\times10^{15}$/cm$^3$.

Further, an impurity element imparting p-type conductivity, such as tin (Sn), may be added to the oxide semiconductor film 644, whereby the oxide semiconductor film 644 has low p-type conductivity. Sn can be added to the oxide semiconductor film 644 as a p-type impurity element by being contained in the oxide semiconductor target as SnOx. Since the highly purified oxide semiconductor film 644 is intrinsic or substantially intrinsic as described above, an oxide semiconductor film having low p-type conductivity can be obtained by adding a slight amount of impurities for controlling valence electrons. As a result, a transistor formed using the oxide semiconductor film 644 can be prevented from being normally-on (a state in which drain current flows even when voltage is not applied to a gate electrode). Further, in order to prevent a normally-on from occurring, a second gate electrode may be provided on a side which faces the gate electrode with the oxide semiconductor film 644 interposed therebetween and therefore the threshold voltage can be controlled.

Note that although the oxide semiconductor film 644 may be amorphous, a crystalline oxide semiconductor film is preferably used for a channel formation region of the transistor. This is because the reliability (resistance to the gate bias stress) of the transistor can be improved by using the crystalline oxide semiconductor film.

Although the crystalline oxide semiconductor film is preferably in a single-crystal state, an oxide including a crystal with c-axis orientation (also referred to as c axis aligned crystal (CAAC)) is also preferable.

Here, an oxide including a crystal with c-axis alignment (also referred to as c-axis aligned crystal (CAAC)), which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

The CAAC will be described in detail with reference to FIGS. 12A to 12E, FIGS. 13A to 13C, and FIGS. 14A to 14C. In FIGS. 12A to 12, FIGS. 13A to 13C, and FIGS. 14A to 14C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

Figure 12A:
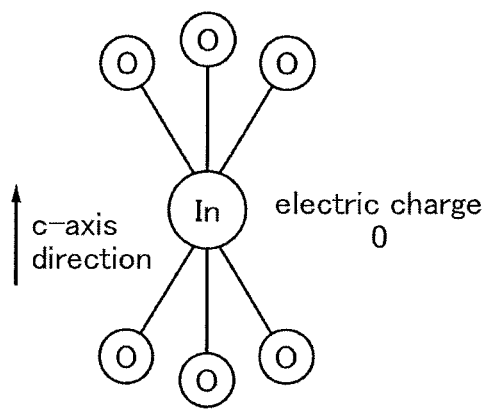
FIGS. 12A to 12E illustrate structures of oxide materials according to one embodiment of the present invention.

FIG. 12A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 12A is actually an octahedral structure, but is illustrated as a planar structure for simplicity. Note that three tetracoordinate O atoms exist in each of an upper half and a lower half in FIG. 12A. In the small group illustrated in FIG. 12A, electric charge is 0.

Figure 12D:
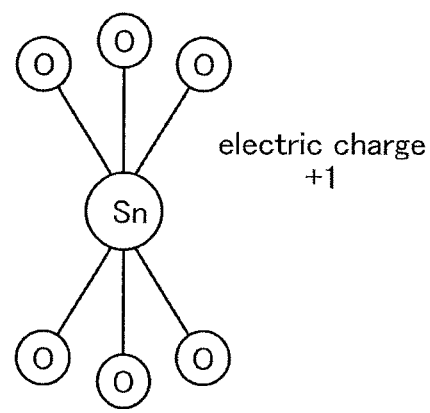
Figure 12B:
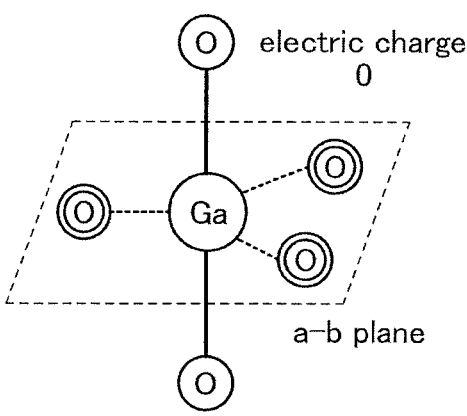

FIG. 12B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 12B. An In atom can also have the structure illustrated in FIG. 12B because an In atom can have five ligands. In the small group illustrated in FIG. 12B, electric charge is 0.

Figure 12E:
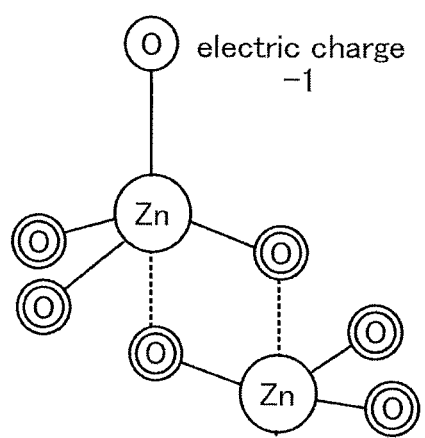
Figure 12C:
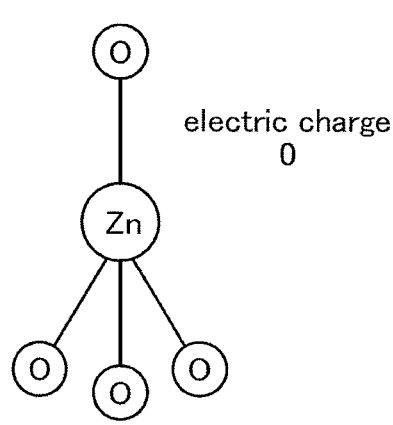

FIG. 12C illustrates a structure including one tetracoordinate Zn atom and four tetracoordinate O atoms proximate to the Zn atom. In FIG. 12C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 12C. In the small group illustrated in FIG. 12C, electric charge is 0.

FIG. 12D illustrates a structure including one hexacoordinate Sn atom and six tetracoordinate O atoms proximate to the Sn atom. In FIG. 12D, three tetracoordinate O atoms exist in each of an upper half and a lower half. In the small group illustrated in FIG. 12D, electric charge is +1.

FIG. 12E illustrates a small group including two Zn atoms. In FIG. 12E, one tetracoordinate O atom exists in each of an upper half and a lower half. In the small group illustrated in FIG. 12E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 12A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 13A:
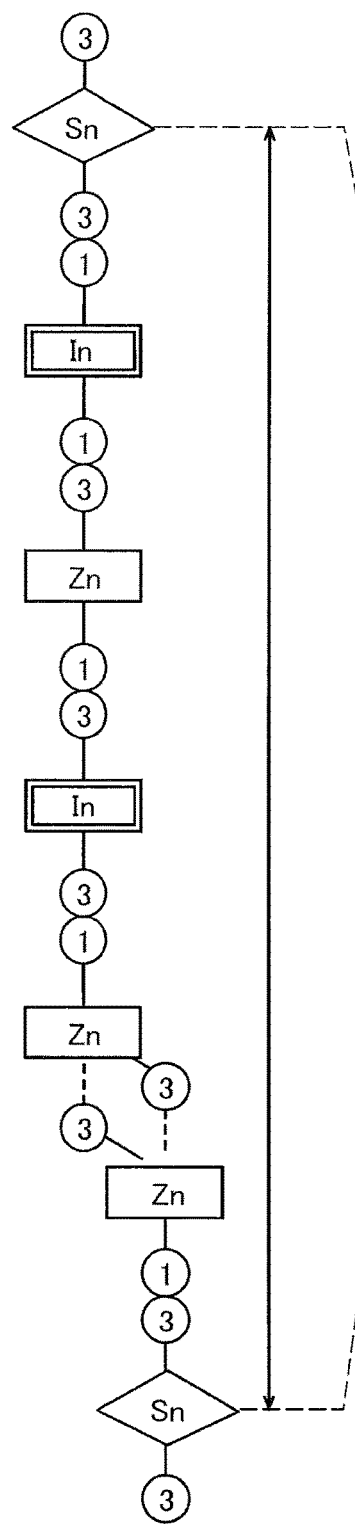
FIGS. 13A to 13C illustrate a structure of an oxide material according to one embodiment of the present invention.
Figure 13B:
Figure 13C:
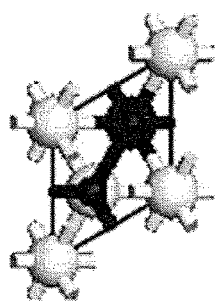

FIG. 13A illustrates a model of a medium group included in a layered structure of an In—Sn—Zn—O-based material. FIG. 13B illustrates a large group including three medium groups. Note that FIG. 13C illustrates an atomic arrangement in the case where the layered structure in FIG. 13B is observed from the c-axis direction.

In FIG. 13A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 13A, one tetracoordinate O atom existing in each of an upper half and a lower half with respect to an In atom is denoted by circled 1. FIG. 13A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 13A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 12E can be given. For example, with one small group including two Zn atoms, electric charge of one small group including a Sn atom can be cancelled, so that the total electric charge of the layered structure can be 0.

When the large group illustrated in FIG. 13B is repeated, an In—Sn—Zn—O-based crystal (In$_2$SnZn$_3$O$_8$) can be obtained. Note that a layered structure of the obtained In—Sn—Zn—O-based crystal can be expressed as a composition formula, In$_2$SnZn$_2$O$_7$(ZnO)$_m$, (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

For example, FIG. 14A illustrates a model of a medium group included in a layered structure of an In—Sn—Zn—O-based material.

In the medium group included in the layered structure of the In—Ga—Zn—O-based material in FIG. 14A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

FIG. 14B illustrates a large group including three medium groups. Note that FIG. 14C illustrates an atomic arrangement in the case where the layered structure in FIG. 14B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 14A but also a medium group in which the arrangement of the In atom, the Ga atom, and the Zn atom is different from that in FIG. 14A.

Sputtering may be performed to form an oxide semiconductor film including CAAC. In order to obtain the oxide semiconductor film including CAAC by sputtering, it is important to form hexagonal crystals in an initial stage of deposition of an oxide semiconductor film and to cause crystal growth from the hexagonal crystals as cores. In order to achieve this, it is preferable that the distance between the target and the substrate be made to be longer (e.g., approximately 150 mm to 200 mm) and a substrate heating temperature be 100° C. to 500° C., more preferably 200° C. to 400° C., or still more preferably 250° C. to 300° C. In addition to this, the deposited oxide semiconductor film is subjected to heat treatment at a temperature higher than the substrate heating temperature in the film formation. Therefore, microdefects in the film and defects at the interface of a stacked layer can be compensated.

The oxide semiconductor film including CAAC, which is highly purified, contains few defects therein due to oxygen deficiency, and includes crystals with c-axis orientation, becomes sensitive to an impurity element for controlling valence electrons, whereby valence electrons can be easily controlled to have low p-type conductivity.

Figure 8B:
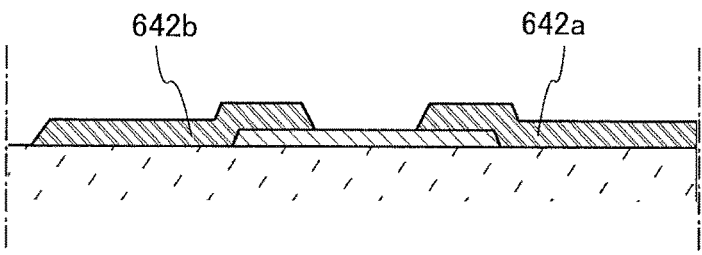

Next, a conductive layer for forming a source electrode and a drain electrode (including a wiring formed in the same layer as the source electrode and the drain electrode) is formed over the oxide semiconductor film 644 and the like and is processed, so that the source or drain electrode 642*a* and the source or drain electrode 642*b* are formed (see FIG. 8B).

The conductive layer can be formed by a PVD method or a CVD method. As a material for the conductive layer, an element selected from aluminum, chromium, copper, tantalum, titanium, molybdenum, and tungsten; an alloy containing any of these elements as its component; or the like can be used. Further, one or more materials selected from manganese, magnesium, zirconium, beryllium, neodymium, and scandium may be used.

The conductive layer can have a single-layer structure or a stacked-layer structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has the single-layer structure of a titanium film or a titanium nitride film, there is an advantage that the source or drain electrode 642*a* and the source or drain electrode 642*b* can be easily processed to be tapered.

Alternatively, the conductive layer may be formed using conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer is preferably etched so that end portions of the source or drain electrode 642*a* and the source or drain electrode 642*b* are tapered. Here, a taper angle is, for example, preferably greater than or equal to 30° and less than or equal to 60°. When etching is performed so that the edge portions of the source or drain electrode 642*a* and the source or drain electrode 642*b* are tapered, the coverage with the gate insulating film 646 to be formed later can be improved and disconnection can be prevented.

Note that the channel length (L) of the transistor in the upper portion is determined by a distance between a lower end portion of the source or drain electrode 642*a* and a lower end portion of the source or drain electrode 642*b*. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure by extreme ultraviolet light, the resolution is high and the focus depth is large. For these reasons, the channel length (L) of the transistor to be formed later can be in the range of greater than or equal to 10 nm and less than or equal to 1000 nm (1 μm), and the circuit can operate at higher speed. Further, power consumption of the memory device can be reduced by miniaturization.

Figure 8C:
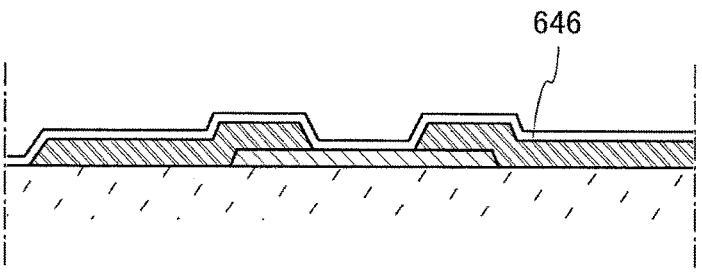

Next, the gate insulating film 646 is formed so as to cover the source or drain electrode 642*a* and the source or drain electrode 642*b* and to be in contact with part of the oxide semiconductor film 644 (see FIG. 8C).

The gate insulating film 646 can be formed by a CVD method, a sputtering method, or the like. The gate insulating film 646 is preferably formed so as to contain silicon oxide, silicon nitride, silicon oxynitride, gallium oxide, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating film 646 may have a single-layer structure or a stacked-layer structure using any of the above materials. There is no particular limitation on the thickness; however, in the case where the memory device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When the gate insulating film 646 is thin as described above, gate leakage due to a tunnel effect or the like becomes a problem. In order to solve the problem of gate leakage, the gate insulating film 646 may be formed using a high dielectric constant (high-k) material such as hafnium oxide, tantalum oxide, yttrium oxide, hafnium silicate ($HfSi_3O_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added. The use of a high-k material for the gate insulating film 646 makes it possible to increase the thickness in order to suppress gate leakage as well as ensuring electric characteristics. Note that a stacked-layer structure of a film containing a high-k material and a film containing any one of silicon oxide, silicon nitride, silicon oxynitride, silicon nitride oxide, aluminum oxide, and the like may be employed.

Further, an insulating film which is in contact with the oxide semiconductor film 644 (the gate insulating film 646 in FIG. 8C) may be an insulating material containing a Group 13 element and oxygen. Many oxide semiconductor materials contain a Group 13 element, and an insulating material containing a Group 13 element works well with an oxide semiconductor. By using such an insulating material containing a Group 13 element for the insulating film which is in contact with the oxide semiconductor film, the state of an interface with the oxide semiconductor film can be kept well.

Here, an insulating material including a Group 13 element refers to an insulating material including one or more Group 13 elements. As the insulating material containing a Group 13 element, gallium oxide, aluminum oxide, aluminum gallium oxide, gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case where the gate insulating film is formed in contact with an oxide semiconductor film containing gallium, when a material containing gallium oxide is used for the gate insulating film, favorable characteristics can be kept at the interface between the oxide semiconductor film and the gate insulating film. Further, when the oxide semiconductor film and the insulating film containing gallium oxide are provided in contact with each other, pileup of hydrogen at the interface between the oxide semiconductor film and the insulating film can be reduced. Note that a similar advantageous effect can be obtained in the case where an element in the same group as a constituent element of the oxide semiconductor is used for the insulating film. For example, it is effective to form an insulating film with the use of a material including aluminum oxide. Note that aluminum oxide has a property of not easily transmitting water. Thus, it is preferable to use the material including aluminum oxide in terms of preventing water from entering the oxide semiconductor film.

The insulating film which is in contact with the oxide semiconductor film 644 preferably contains oxygen in a proportion higher than that in the stoichiometric composition, by heat treatment under an oxygen atmosphere, oxygen doping, or the like. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed using an ion implantation method or an ion doping method.

For example, in the case where the insulating film which is in contact with the oxide semiconductor film 644 is formed of gallium oxide, the composition of gallium oxide can be set to be $Ga_2O_x$ ($x=3+\alpha$, $0<\alpha<1$) by heat treatment under an oxygen atmosphere or oxygen doping. In the case where the insulating film which is in contact with the oxide semiconductor film 644 is formed of aluminum oxide, the composition of aluminum oxide can be set to be $Al_2O_x$ ($x=3+\alpha$, $0<\alpha<1$) by heat treatment under an oxygen atmosphere or oxygen doping. In the case where the insulating film which is in contact with the oxide semiconductor film 644 is formed of gallium aluminum oxide (or aluminum gallium oxide), the composition of gallium aluminum oxide (or aluminum gallium oxide) can be set to be $Ga_xAl_{2-x}O_{3\alpha}$ ($0<x<2$, $0<\alpha<1$) by heat treatment under an oxygen atmosphere or oxygen doping.

By oxygen doping or the like, an insulating film including a region where the proportion of oxygen is higher than that in the stoichiometric proportion can be formed. When the insulating film including such a region is in contact with the oxide semiconductor film, oxygen that exists excessively in the insulating film is supplied to the oxide semiconductor film, and oxygen deficiency in the oxide semiconductor film or at the interface between the oxide semiconductor film and the insulating film is reduced. Thus, the oxide semiconductor film can be formed to an intrinsic (i-type) or substantially intrinsic oxide semiconductor.

Note that instead of the gate insulating film 646, the insulating film including the region where the proportion of oxygen is higher than that in the stoichiometric composition may be used for a base film of the oxide semiconductor film 644 or may be used for both the gate insulating film 646 and the base insulating film.

After the gate insulating film 646 is formed, second heat treatment is preferably performed under an inert gas atmosphere or an oxygen atmosphere. The temperature of the heat treatment is set in the range of higher than or equal to 200° C. and lower than or equal to 450° C., preferably higher than or equal to 250° C. and lower than or equal to 350° C. For example, the heat treatment may be performed at 250° C. under a nitrogen atmosphere for 1 hour. The second heat treatment can reduce variation in electric characteristics of the transistor. Further, in the case where the gate insulating film 646 includes oxygen, oxygen is supplied to the oxide semiconductor film 644 to compensate for oxygen deficiency in the oxide semiconductor film 644, whereby an i-type (intrinsic) or substantially i-type oxide semiconductor film can be formed.

Note that in this embodiment, although the second heat treatment is performed after the gate insulating film 646 is formed, the timing of the second heat treatment is not limited thereto. For example, the second heat treatment may be performed after a gate electrode is formed. Alternatively, the first heat treatment and the second heat treatment may be successively performed, the first heat treatment may also serve as the second heat treatment, or the second heat treatment may also serve as the first heat treatment.

As described above, at least one of the first heat treatment and the second heat treatment is employed, whereby the substance including a hydrogen atom can be excluded as much as possible and the oxide semiconductor film 644 can be highly purified.

Figure 8D:
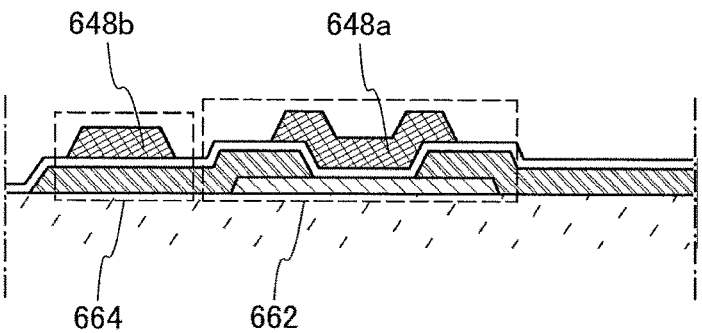

Next, a conductive layer for forming a gate electrode (including a wiring formed using the same layer as the gate electrode) is formed and is processed, so that the gate electrode 648a and the conductive film 648b are formed (see FIG. 8D).

The gate electrode 648a and the conductive film 648b can be formed using a metal material such as molybdenum, titanium, tantalum, tungsten, aluminum, copper, neodymium, or scandium; or an alloy material including any of these materials as its main component. Note that the gate electrode 648a and the conductive film 648b may have a single-layer structure or a stacked-layer structure.

Through the above steps, the transistor 662 including the highly-purified oxide semiconductor film 644 and the capacitor 664 are completed (see FIG. 8D).

Note that in the case where the transistor 332 and the capacitor 334 illustrated in FIG. 7A are formed, the source or drain electrode 642a and the source or drain electrode 642b are formed over the insulating film 640; and the oxide semiconductor film 644 is formed over the insulating film 640, the source or drain electrode 642a, and the source or drain electrode 642b. Next, the gate insulating film 646 is formed over the source or drain electrode 642a, the source or drain electrode 642b, and the oxide semiconductor film 644. After that, the gate electrode 648a is formed over the gate insulating film 646 so as to overlap with the oxide semiconductor film 644; and a conductive film 648b is formed over the gate insulating film 646 so as to overlap with the source or drain electrode 642b.

In the case where the transistor 342 and the capacitor 344 illustrated in FIG. 7B are formed, the gate electrode 648a and the conductive film 648b are formed over the insulating film 640; and the gate insulating film 646 is formed over the insulating film 640, the gate electrode 648a, and the conductive film 648b. Next, the source or drain electrode 642a and the source or drain electrode 642b are formed over the gate insulating film 646. After that, the oxide semiconductor film 644 is formed over the gate insulating film 646 so as to overlap with the gate electrode 648a, whereby the transistor 342 and the capacitor 344 are completed. Note that the insulating film 650 and the insulating film 652 may be formed so as to cover the transistor 342 and the capacitor 344. For example, it is preferable that the insulating material of the insulating film 650 contain oxygen in a proportion higher than that in the stoichiometric composition, by heat treatment under an oxygen atmosphere or oxygen doping, and the insulating film 652 do not easily transmit water or hydrogen. When the insulating film 652 does not allow water or hydrogen to transmit easily, water or hydrogen is prevented from entering the oxide semiconductor film 644;

and when the insulating film 650 contains oxygen in a proportion higher than that in the stoichiometric composition, oxygen deficiency in the oxide semiconductor film 644 can be filled; thus, the oxide semiconductor film 644 which is i-type (intrinsic) or substantially i-type can be formed.

In the case where the transistor 352 and the capacitor 354 illustrated in FIG. 7C are formed, the gate electrode 648a and a conductive film 648b are formed over the insulating film 640; and the gate insulating film 646 is formed over the insulating film 640, the gate electrode 648a, and the conductive film 648b. Next, the oxide semiconductor film 644 is formed over the gate insulating film 646 so as to overlap with the gate electrode 648a. After that, the source or drain electrode 642a and the source or drain electrode 642b are formed over the oxide semiconductor film 644, whereby the transistor 352 and the capacitor 354 are completed. Note that for an insulating film 650 and an insulating film 652, the description of FIG. 7B can be referred to.

In the case where the transistor 362 and a capacitor 364 illustrated in FIG. 7D are formed, the gate electrode 648a and the conductive film 648b are formed over the insulating film 640; and the gate insulating film 646 (a first gate insulating film in FIG. 7D) is formed over the insulating film 640, the gate electrode 648a (a first gate electrode in FIG. 7D), and the conductive film 648b. Next, the oxide semiconductor film 644 is formed over the gate insulating film 646 so as to overlap with the gate electrode 648a, and the source or drain electrode 642a and the source or drain electrode 642b are formed over the oxide semiconductor film 644. After that, the insulating film 650 (a second gate insulating film in FIG. 7D) is formed over the oxide semiconductor film 644, the source or drain electrode 642a, and the source or drain electrode 642b; and the conductive film 659 (a second gate electrode in FIG. 7D) is formed so as to overlap with the oxide semiconductor film 644, whereby the transistor 362 and the capacitor 364 are completed. Note that for the conductive film 659, the description of the gate electrode 648a can be referred to.

Next, a method for manufacturing the transistors and the capacitors which are illustrated in FIGS. 6A and 6B will be described.

The method for manufacturing the transistor 312 and the capacitor 314 illustrated in FIG. 6A will be described.

First, the oxide semiconductor film 644 is formed over an insulating film 640, and an oxide conductive film and a conductive layer are stacked over the insulating film 640 and the oxide semiconductor film 644.

As a film formation method for the oxide conductive film, a sputtering method, a vacuum evaporation method (e.g., an electron beam evaporation method), an arc discharge ion plating method, or a spray method is used. As a material for the oxide conductive film, zinc oxide, zinc aluminum oxide, zinc aluminum oxynitride, zinc gallium oxide, indium tin oxide, or the like can be used. In addition, any of the above materials may contain silicon oxide. Note that for the formation method and the material of the conductive layer, the description of the conductive layer for forming the source or drain electrode 642a and the source or drain electrode 642b can be referred to.

Next, a mask is formed over the conductive layer, and the conductive layer and the oxide conductive film are selectively etched, whereby the source or drain electrode 642a, the source or drain electrode 642b, the oxide conductive film 643a, and the oxide conductive film 643b are formed.

In order to prevent excessive etching of the oxide semiconductor film in etching treatment performed on the conductive layer and the oxide conductive film, etching conditions (e.g., the kind of etchant, the concentration, and the etching time) are adjusted as appropriate.

Next, the gate insulating film 646 is formed over the source or drain electrode 642a, the source or drain electrode 642b, and the oxide semiconductor film 644. After that, a gate electrode 648a is formed over the gate insulating film 646 so as to overlap with the oxide semiconductor film 644; and the conductive film 648b is formed over the gate insulating film 646 so as to overlap with the source or drain electrode 642b.

Through the above steps, the transistor 312 and the capacitor 314 are completed (see FIG. 6A).

In the case where the transistor 322 and the capacitor 324 illustrated in FIG. 6B are manufactured, a stack of an oxide semiconductor film and an oxide conductive film is formed, and the stack of the oxide semiconductor film and the oxide conductive film is processed into an island-shaped oxide semiconductor film and an island-shaped oxide conductive film through the same photolithography step. Next, after the source or drain electrode 642a and the source or drain electrode 642b are formed over the island-shaped oxide conductive film, with the use of the source or drain electrode 642a and the source or drain electrode 642b as masks, the island-shaped oxide conductive film is etched, so that the oxide conductive film 643a and the oxide conductive film 643b which are to be a source region and a drain region are formed.

Next, a gate insulating film 646 is formed over the source or drain electrode 642a, the source or drain electrode 642b, and the oxide semiconductor film 644. After that, a gate electrode 648a is formed over the gate insulating film 646 so as to overlap with the oxide semiconductor film 644; and a conductive film 648b is formed over the gate insulating film 646 so as to overlap with the source or drain electrode 642b.

Through the above steps, the transistor 322 and the capacitor 324 are completed (see FIG. 6B).

In each of the transistors described above, the oxide semiconductor film 644 is highly purified. Therefore, the hydrogen concentration is lower than or equal to $5 \times 10^{19}/cm^3$, preferably lower than or equal to $5 \times 10^{18}/cm^3$, or more preferably lower than or equal to $5 \times 10^{17}/cm^3$. The oxide semiconductor film 644 has a sufficiently low carrier density (e.g., lower than $1 \times 10^{12}/cm^3$, more preferably lower than $1.45 \times 10^{10}/cm^3$) as compared to a general silicon wafer having a carrier density of approximately $1 \times 10^{14}/cm^3$. In addition, the off-state current of the transistor is sufficiently small. For example, the off-state current (here, per unit channel width (1 μm)) of the transistor at room temperature (25° C.) is lower than or equal to 100 zA/μm (1 zA (zeptoampere) is $1 \times 10^{-21}$ A), preferably lower than or equal to 10 zA/μm.

Further, in the oxide semiconductor film 644, the concentrations of alkali metal and alkaline earth metal are sufficiently reduced; for example, in the case of Na, the concentration is lower than or equal to $5 \times 10^{16}$ $cm^{-3}$, preferably lower than or equal to $1 \times 10^{16}$ $cm^{-3}$, or more preferably lower than or equal to $1 \times 10^{15}$ $cm^{-3}$; in the case of Li, the concentration is lower than or equal to $5 \times 10^{15}$ $cm^{-3}$, preferably lower than or equal to $1 \times 10^{15}$ $cm^{-3}$; and in the case of K, the concentration is lower than or equal to $5 \times 10^{15}$ $cm^{-3}$, preferably lower than or equal to $1 \times 10^{15}$ $cm^{-3}$.

In this manner, by using the oxide semiconductor film 644 which is purified to be intrinsic, it becomes easier to sufficiently reduce the off-state current of the transistor. Further, with the use of such a transistor, a memory device capable of retaining stored data for an extremely long time can be obtained.

<Application Example of Memory Device>

Application examples of the above memory devices will be described below with reference to FIG. 9 and FIG. 10.

Figure 9:
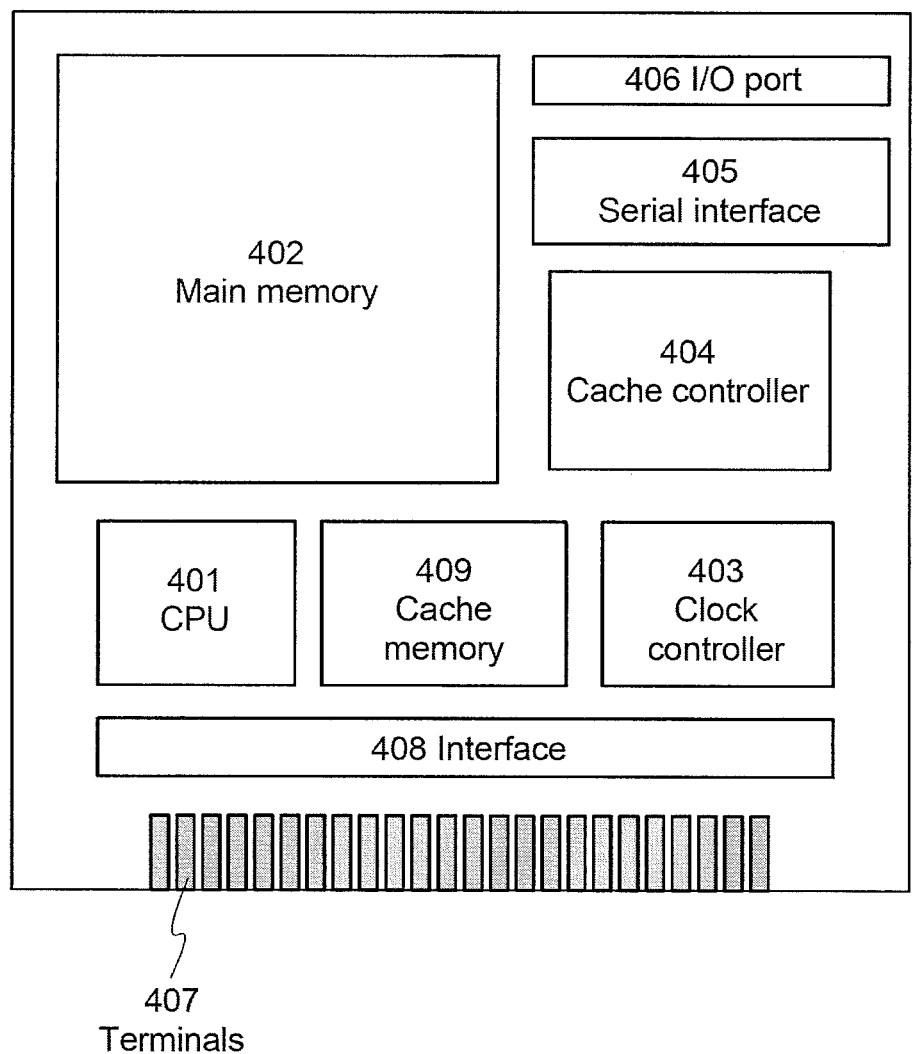
FIG. 9 is a block diagram showing a configuration example of a microprocessor.

FIG. 9 is a block diagram showing a configuration example of a microprocessor. The microprocessor illustrated in FIG. 9 includes a CPU 401, a main memory 402, a clock controller 403, a cache controller 404, a serial interface 405, an I/O port 406, terminals 407, an interface 408, a cache memory 409, and the like. It is needless to say that the microprocessor illustrated in FIG. 9 is just an example of the simplified structure, and practical microprocessors have various structures depending on usage.

In order to make the CPU 401 operate at high speed, a high-speed memory appropriate for the speed thereof is needed. However, the use of a high-speed large capacity memory whose access time is appropriate for the operation speed of the CPU 401 generally involves high cost. Thus, in addition to the main memory 402 having large capacity, the cache memory 409 which is a high-speed memory having smaller capacity than the main memory 402, for example, an SRAM, is located between the CPU 401 and the main memory 402. The CPU 401 can operate at high speed regardless of the speed of the main memory 402 by accessing the cache memory 409.

In the microprocessor illustrated in FIG. 9, the above memory device can be used for the main memory 402. With the above structure, a highly integrated microprocessor and highly reliable microprocessor can be realized.

Note that a program to be executed in the CPU 401 is stored in the main memory 402. The program stored in the main memory 402 is downloaded in the cache memory 409 in the initial execution, for example. Not only the program stored in the main memory 402 but also a program in another external memory can be downloaded. The cache memory 409 not only store the program executed in the CPU but also functions as a work region and temporarily stores the calculation results or the like of the CPU 401.

Note that the CPU is not limited to one, and a plurality of CPUs may be provided. When a plurality of CPUs is provided and the processing is performed in parallel, the operation speed can be improved. In that case, when the processing speeds of CPUs are uneven, malfunction may occur in some cases as a whole processing; therefore, the processing speeds of CPUs to be slaves may be balanced by CPUs to be masters.

Note that although the microprocessor is exemplified here, the usages of the above memory devices are not limited to the main memory of the microprocessor. For example, the above memory devices are preferably used as a video RAM which is used in a driver circuit of a display device or a large capacity memory which is necessary for an image processing circuit. Besides, also in LSI having various systems, the above memory devices can be used as a large capacity memory or a small-sized memory.

Figure 10:
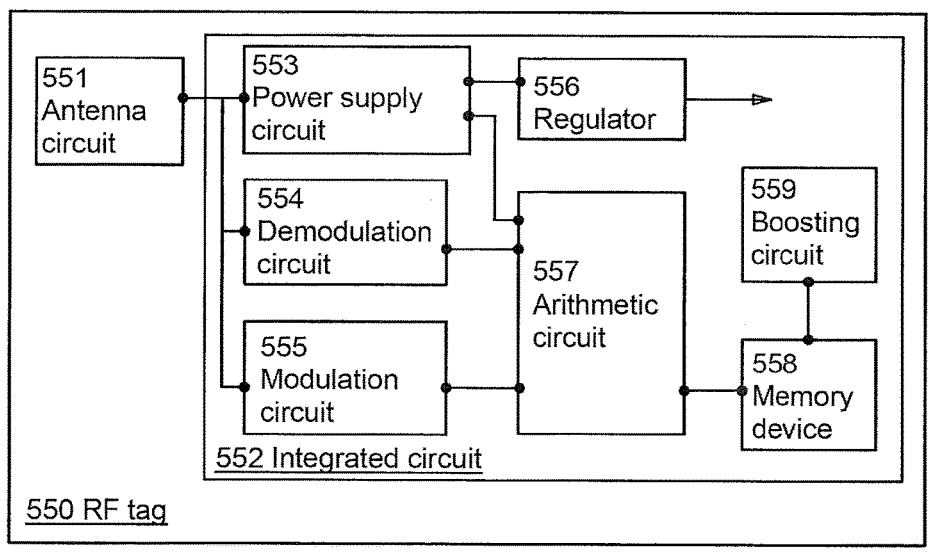
FIG. 10 is a block diagram showing a configuration example of an RF tag.

FIG. 10 is a block diagram showing a configuration example of an RFID tag. In FIG. 10, an RF tag 550 includes an antenna circuit 551 and an integrated circuit 552. The integrated circuit 552 includes a power supply circuit 553, a demodulation circuit 554, a modulation circuit 555, a regulator 556, an arithmetic circuit 557, a memory device 558, and a boosting circuit 559. Note that the above memory device is applied to the memory device 558.

An example of the operation of the RF tag 550 is described. When a radio wave is transmitted from an interrogator, the radio wave is converted into an AC voltage in the antenna circuit 551. In the power supply circuit 553, the AC voltage from the antenna circuit 551 is rectified to generate a voltage for a power supply. The voltage for a power supply, which is generated in the power supply circuit 553, is fed to the arithmetic circuit 557 and the regulator 556. After the voltage for a power supply from the power supply circuit 553 is stabilized or after the level thereof is adjusted, the regulator 556 supplies the voltage to circuits such as the demodulation circuit 554, the modulation circuit 555, the arithmetic circuit 557, the memory device 558, or the boosting circuit 559 in the integrated circuit 552.

The demodulation circuit 554 demodulates an AC signal received by the antenna circuit 551 and outputs the signal to the arithmetic circuit 557 of the next stage. The arithmetic circuit 557 performs arithmetic processing in accordance with the signal input from the demodulation circuit 554 and generates another signal. In the above arithmetic processing, the memory device 558 can be used as a primary cache memory or a secondary cache memory. Further, the arithmetic circuit 557 analyzes the signal input from the demodulation circuit 554, and data in the memory device 558 is output or an instruction in the memory device 558 is executed in response to an instruction transmitted from the interrogator. The signal output from the arithmetic circuit 557 is encoded and transmitted to the modulation circuit 555. The modulation circuit 555 modulates a radio wave received by the antenna circuit 551 in accordance with the signal. The radio wave modulated in the antenna circuit 551 is received by the interrogator.

In such a manner, communication between the RF tag 550 and the interrogator is performed by modulating a radio wave used as a carrier (a carrier wave). As the carrier, there are radio waves with frequencies of 125 kHz, 13.56 MHz, 950 MHz, and the like, which are various depending on the standard. A modulation method includes various methods such as amplitude modulation, frequency modulation, and phase modulation, depending on the standard; however, any modulation may be employed as long as it is based on the standard.

A transmission method of signals can be classified into a variety of kinds such as an electromagnetic coupling method, an electromagnetic induction method, a microwave method, and the like, depending on the wavelength of the carrier.

The boosting circuit 559 boosts voltage output from the regulator 556 and supplies the voltage to the memory device 558.

In the RF tag 550 illustrated in FIG. 10, high integration and high reliability can be realized by using the above memory device as the memory device 558.

Note that although the structure of the RF tag 550 including the antenna circuit 551 is described here, the RF tag illustrated in FIG. 10 does not necessarily include an antenna circuit. In addition, the RF tag illustrated in FIG. 10 may be provided with an oscillation circuit or a secondary battery.

Embodiment 2

The actually measured field-effect mobility of an insulated gate transistor can be lower than its original mobility because of a variety of reasons; this phenomenon occurs not only in the case of using an oxide semiconductor. One of the reasons that reduce the mobility is the presence of a defect inside a semiconductor or a defect at an interface between the semiconductor and an insulating film. When a Levinson model is used, the field-effect mobility on the assumption that no defect exists inside the semiconductor can be calculated theoretically. Thus, in this embodiment, calculation results of characteristics of minute transistors which are manufactured using an oxide semiconductor are shown together with theoretical calculation of the field-effect mobility of an ideal oxide semiconductor without a defect inside a semiconductor.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

[FORMULA 2]

$$\mu = \mu_0 \exp\left(-\frac{E}{kT}\right) \quad (2)$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

[FORMULA 3]

$$E = \frac{e^2 N^2}{8\varepsilon n} = \frac{e^3 N^2 t}{8\varepsilon C_{ox} V_g} \quad (3)$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula.

[FORMULA 4]

$$I_d = \frac{W \mu V_g V_d C_{ox}}{L} \exp\left(-\frac{E}{kT}\right) \quad (4)$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

[FORMULA 5]

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kt\varepsilon C_{ox} V_g} \quad (5)$$

The right side of Formula 5 is a function of $V_g$. From the formula, it is found that the defect density N can be obtained from the slope of a line in which $\ln(I_d/V_g)$ is the ordinate and $1/V_g$ is the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1\times10^{12}/\text{cm}^2$.

On the basis of the defect density obtained in this manner, or the like, $\mu_0$ can be calculated to be 120 cm$^2$/Vs from Formula 2 and Formula 3. The measured mobility of an In—Sn—Zn oxide including defects is approximately 35 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulating film affects the transport property of the transistor. In other words, the mobility $\mu_1$ at a position that is distance x away from the interface between the channel and the gate insulating film can be expressed by the following equation.

[FORMULA 6]

$$\frac{1}{\mu_1} = \frac{1}{\mu_0} + \frac{D}{B}\exp\left(-\frac{x}{l}\right) \quad (6)$$

Here, D represents the electric field in the gate direction, and B and G are constants. B and G can be obtained from actual measurement results, according to the above measurement results, B is 4.75×10$^7$ cm/s and G is 10 nm (the depth to which the influence of interface scattering reaches). When D is increased (i.e., when the gate voltage is increased), the second term of the right side of Formula 6 is increased and accordingly the mobility $\mu_1$ is decreased.

Figure 15:
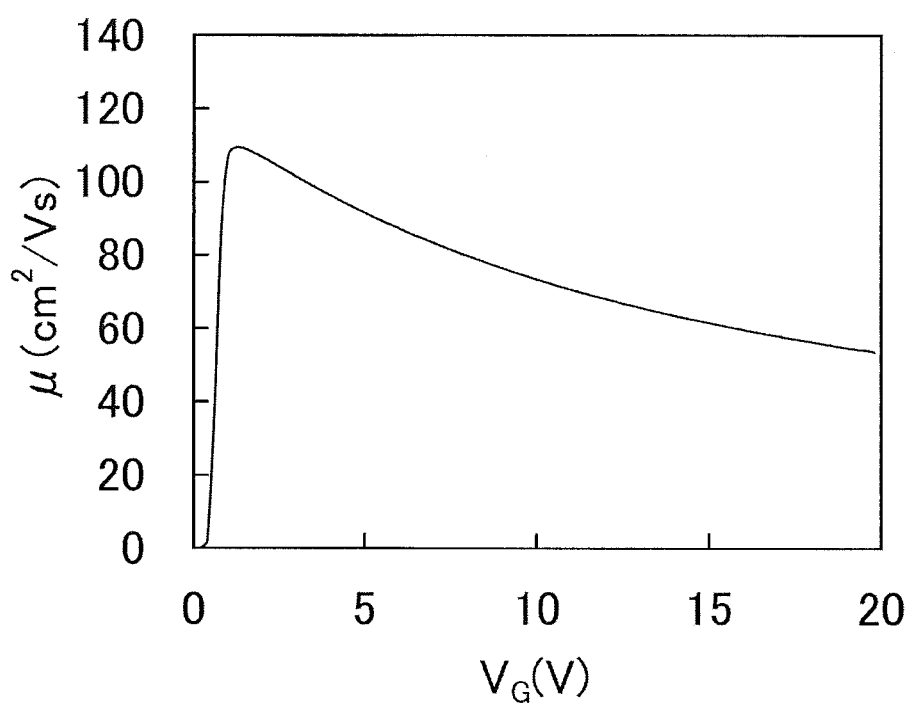
FIG. 15 shows the gate voltage dependence of mobility obtained by calculation.

Calculation results of the mobility $\mu_2$ of a transistor whose channel includes an ideal oxide semiconductor without a defect inside the semiconductor are shown in FIG. 15. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 15, the mobility has a peak of more than 100 cm$^2$/Vs at a gate voltage that is a little over 1 V and is decreased as the gate voltage becomes higher because the influence of interface scattering is increased. Note that in order to reduce interface scattering, it is preferable that a surface of the semiconductor layer be flat at the atomic level (atomic layer flatness).

Calculation results of characteristics of minute transistors which are manufactured using an oxide semiconductor having such a mobility are shown in FIGS. 16A to 16C, FIGS. 17A to 17C, and FIGS. 18A to 18C. FIGS. 19A and 19B illustrate cross-sectional structures of the transistors used for the calculation. The transistors illustrated in FIGS. 19A and 19B each include a semiconductor region 8103a and a semiconductor region 8103c which have n$^+$-type conductivity in an oxide semiconductor layer. The resistivity of the semiconductor region 8103a and the resistivity of the semiconductor region 8103c are each 2×☐10⁻³ Ωcm.

The transistor illustrated in FIG. 19A is formed over a base insulating layer 8101 and an embedded insulating layer 8102 which is embedded in the base insulating layer 8101 and formed of aluminum oxide. The transistor includes the semiconductor region 8103a, the semiconductor region 8103c, an intrinsic semiconductor region 8103b serving as a channel formation region therebetween, and a gate 8105.

A gate insulating film 8104 is formed between the gate 8105 and the semiconductor region 8103b. In addition, a sidewall insulator 8106a and a sidewall insulator 8106b are formed on both side surfaces of the gate 8105, and an insulator 8107 is formed over the gate 8105 so as to prevent a short circuit between the gate 8105 and another wiring. The sidewall insulator has a width of 5 nm. A source 8108a and a drain 8108b are provided in contact with the semiconductor region 8103a and the semiconductor region 8103c, respectively. Note that the channel width of this transistor is 40 nm.

The transistor illustrated in FIG. 19B is the same as the transistor illustrated in FIG. 19A in that it is formed over the base insulating layer 8101 and the embedded insulating layer 8102 formed of aluminum oxide and that it includes the semiconductor region 8103a, the semiconductor region 8103c, the intrinsic semiconductor region 8103b provided therebetween, the gate 8105 having a width of 33 nm, the gate insulating film 8104, the sidewall insulator 8106a, the sidewall insulator 8106b, the insulator 8107, the source 8108a, and the drain 8108b.

The transistor illustrated in FIG. 19A is different from the transistor illustrated in FIG. 19B in the conductivity type of semiconductor regions under the sidewall insulator 8106a and the sidewall insulator 8106b. In the transistor illustrated in FIG. 19A, the semiconductor regions under the sidewall insulator 8106a and the sidewall insulator 8106b are part of the semiconductor region 8103a having n⁺-type conductivity and part of the semiconductor region 8103c having n⁺-type conductivity, whereas in the transistor illustrated in FIG. 19B, the semiconductor regions under the sidewall insulator 8106a and the sidewall insulator 8106b are part of the intrinsic semiconductor region 8103b. In other words, a region having a width of $L_{off}$ which overlaps with neither the semiconductor region 8103a (the semiconductor region 8103c) nor the gate 8105 is provided. This region is called an offset region, and the width $L_{off}$ is called an offset length. As is seen from the drawing, the offset length is equal to the width of the sidewall insulator 8106a (the sidewall insulator 8106b).

Figure 16A:
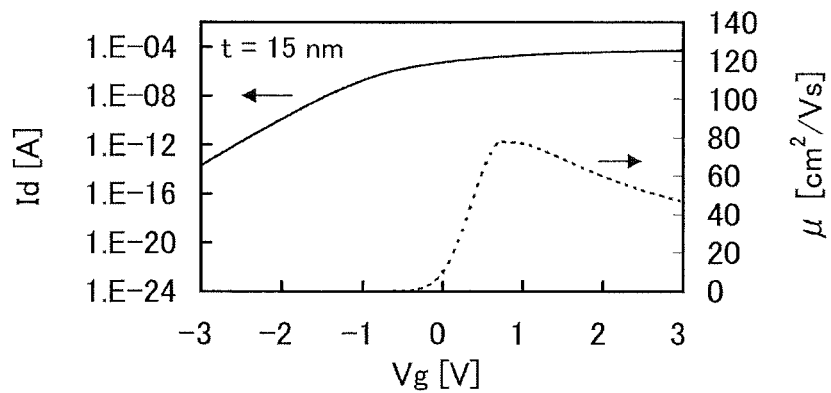
FIGS. 16A to 16C show the gate voltage dependence of drain current and mobility obtained by calculation.
Figure 16B:
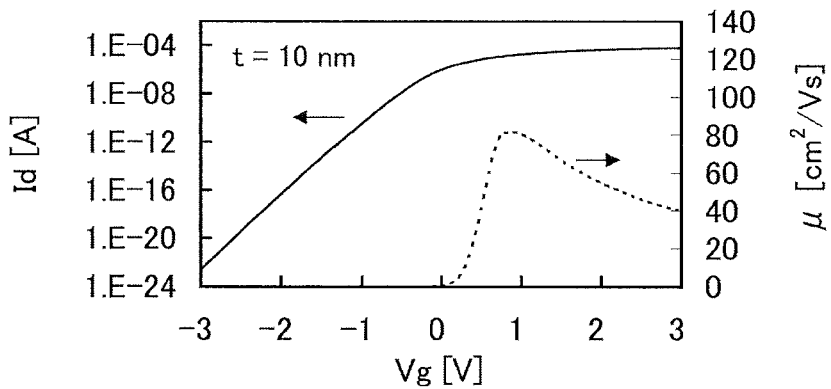
Figure 16C:
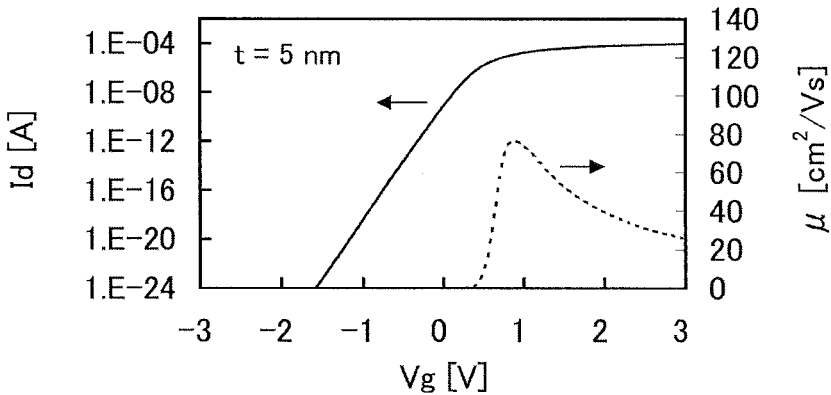

The other parameters used in calculation are as described above. For the simulation, device simulation software Sentaurus Device manufactured by Synopsys, Inc. was used. FIGS. 16A to 16C show the gate voltage ($V_g$: a potential difference between the gate and the source) dependence of the drain current ($I_d$, a solid line) and the mobility ($\mu$, a dotted line) of the transistor having the structure illustrated in FIG. 19A. The drain current $I_d$ is obtained by calculation under the assumption that the drain voltage (a potential difference between the drain and the source) is +1 V and the mobility $\mu$ is obtained by calculation under the assumption that the drain voltage is +0.1 V.

FIG. 16A shows the gate voltage dependence of the transistor in the case where the thickness t of the gate insulating film is 15 nm, FIG. 16B shows that of the transistor in the case where the thickness t of the gate insulating layer is 10 nm, and FIG. 16C shows that of the transistor in the case where the thickness t of the gate insulating layer is 5 nm. As the gate insulating film is thinner, the drain current $I_d$ (off-state current) particularly in an off state is significantly decreased. In contrast, there is no noticeable change in the peak value of the mobility $\mu$ and the drain current $I_d$ (on-state current) in an on state. The graphs show that the drain current exceeds 10 μA, which is required in a memory cell and the like, at a gate voltage of around 1 V.

Figure 17A:
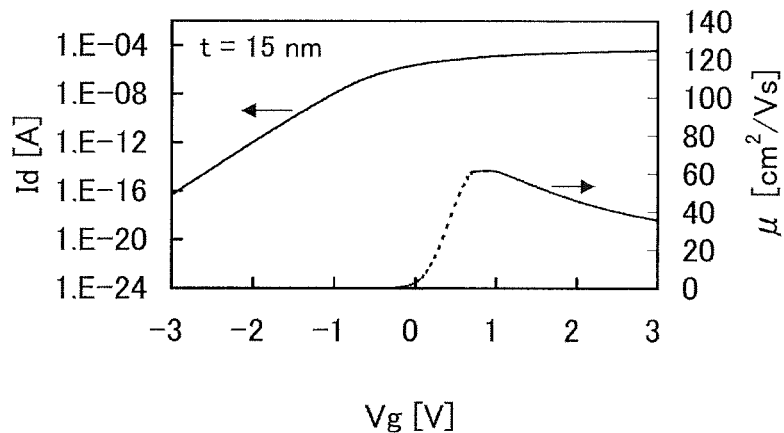
FIGS. 17A to 17C show the gate voltage dependence of drain current and mobility obtained by calculation.
Figure 17B:
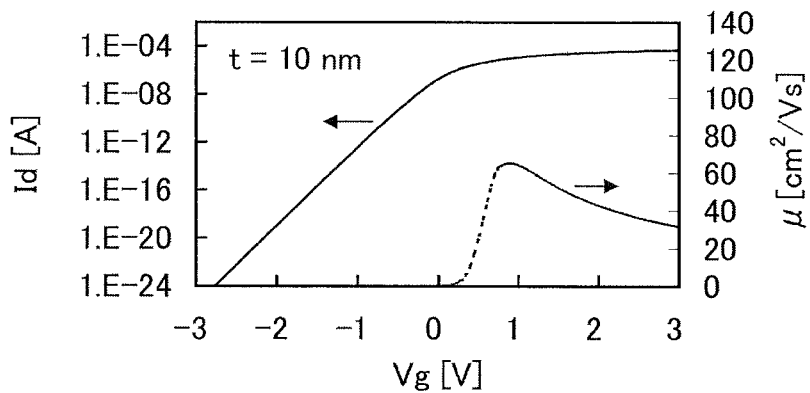
Figure 17C:
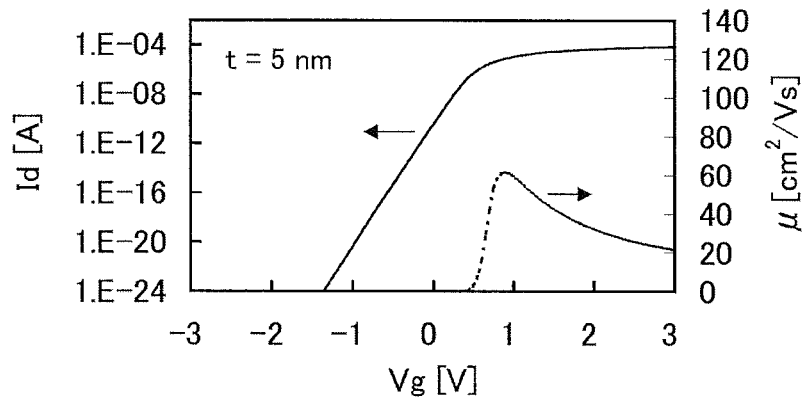

FIGS. 17A to 17C show the gate voltage $V_g$ dependence of the drain current $I_d$ (a solid line) and the mobility $\mu$ (a dotted line) of the transistor having the structure illustrated in FIG. 19B where the offset length $L_{off}$ is 5 nm. The drain current $I_d$ is obtained by calculation under the assumption that the drain voltage is +1 V and the mobility $\mu$ is obtained by calculation under the assumption that the drain voltage is +0.1 V. FIG. 17A shows the gate voltage dependence of the transistor in the case where the thickness of the gate insulating film is 15 nm, FIG. 17B shows that of the transistor in the case where the thickness of the gate insulating film is 10 nm, and FIG. 17C shows that of the transistor in the case where the thickness of the gate insulating film is 5 nm.

Figure 18A:
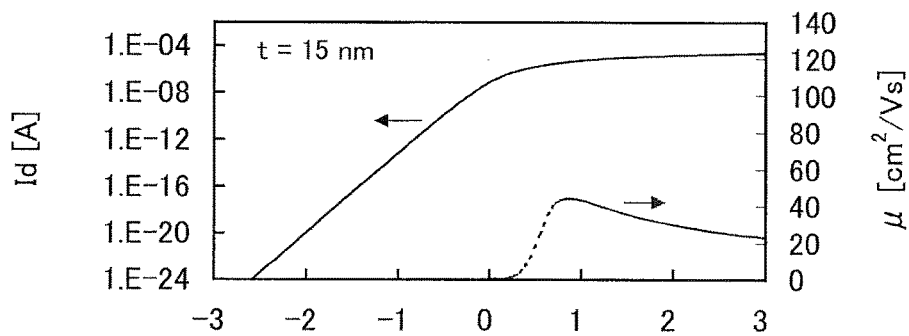
FIGS. 18A to 18C show the gate voltage dependence of drain current and mobility obtained by calculation.
Figure 18B:
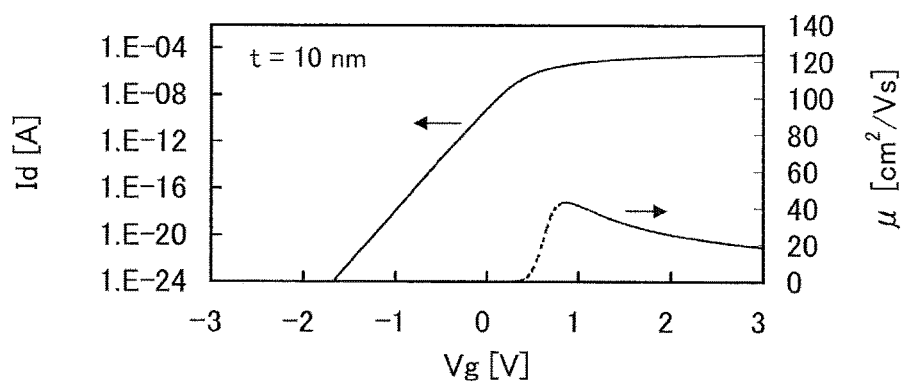
Figure 18C:
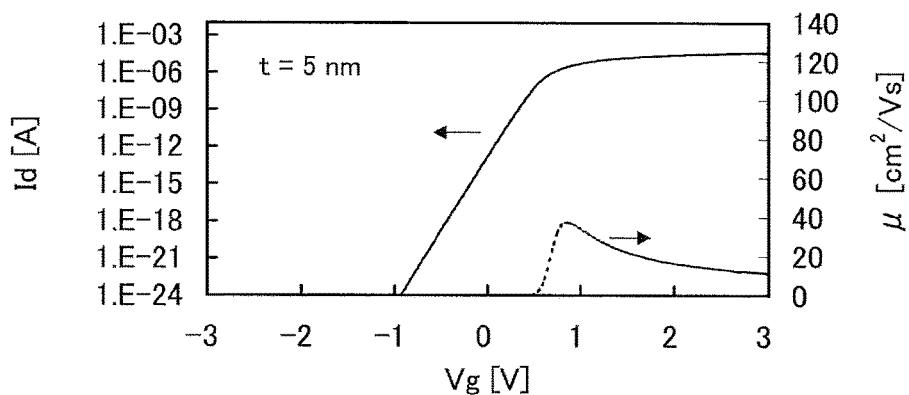
Figure 19A:
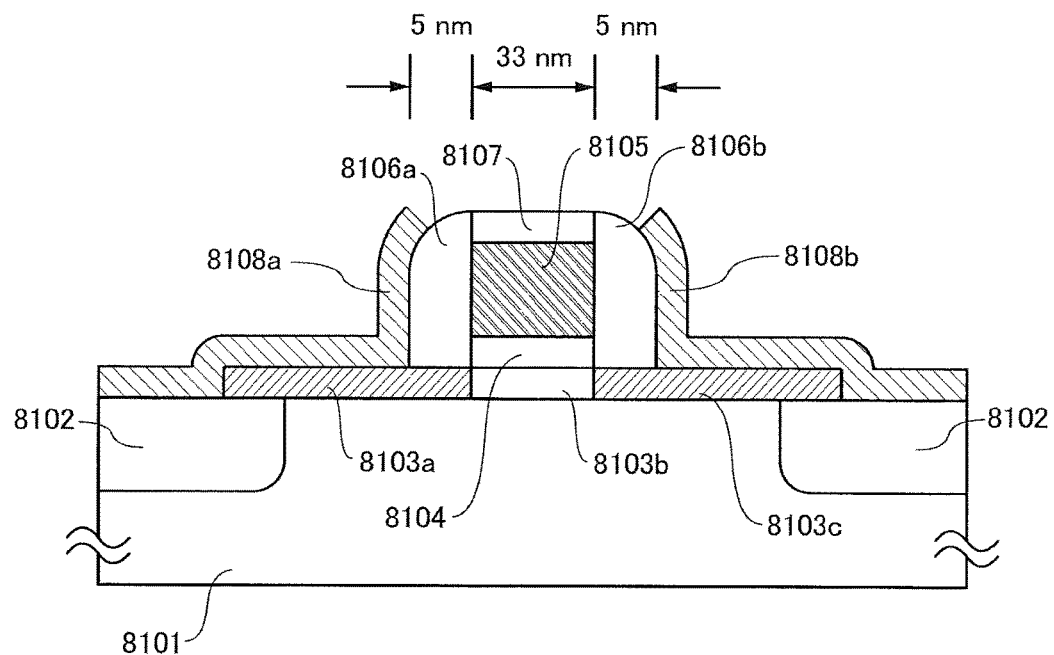
FIGS. 19A and 19B illustrate cross-sectional structures of transistors which are used in calculation.
Figure 19B:
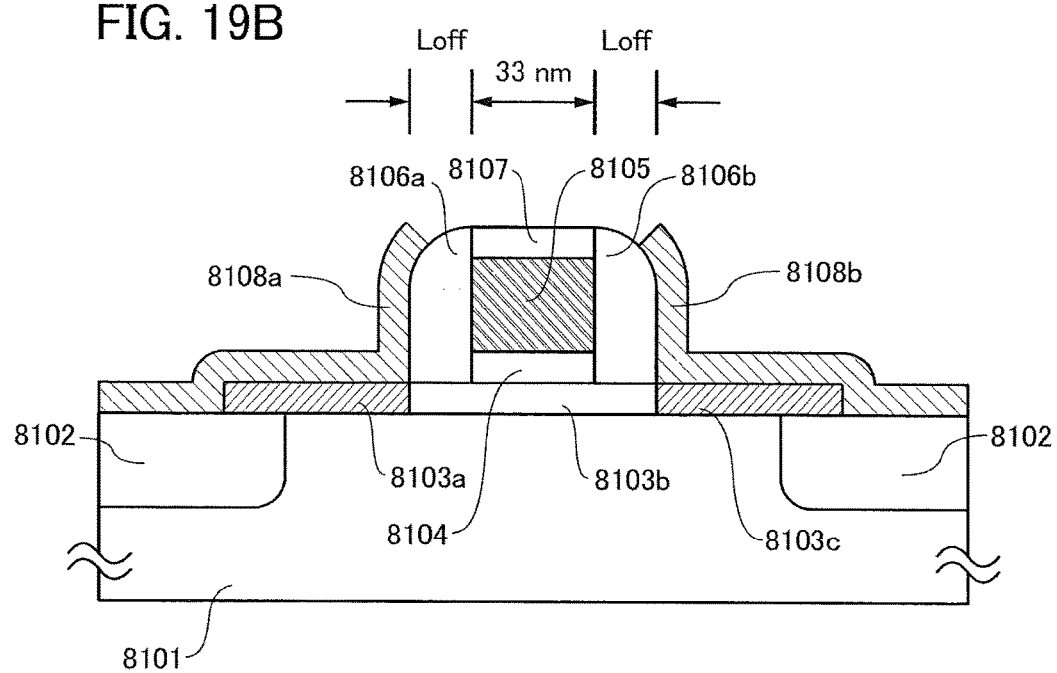

Further, FIGS. 18A to 18C show the gate voltage dependence of the drain current $I_d$ (a solid line) and the mobility $\mu$ (a dotted line) of the transistor having the structure illustrated in FIG. 19B where the offset length $L_{off}$ is 15 nm. The drain current $I_d$ is obtained by calculation under the assumption that the drain voltage is +1 V and the mobility $\mu$ is obtained by calculation under the assumption that the drain voltage is +0.1 V. FIG. 18A shows the gate voltage dependence of the transistor in the case where the thickness of the gate insulating film is 15 nm, FIG. 18B shows that of the transistor in the case where the thickness of the gate insulating film is 10 nm, and FIG. 18C shows that of the transistor in the case where the thickness of the gate insulating film is 5 nm.

In either of the structures, as the gate insulating layer is thinner, the off-state current is significantly decreased, whereas no noticeable change arises in the peak value of the mobility $\mu$ and the on-state current.

Note that the peak of the mobility $\mu$ is approximately 80 cm²/Vs in FIGS. 16A to 16C, approximately 60 cm²/Vs in FIGS. 17A to 17C, and approximately 40 cm²/Vs in FIGS. 18A to 18C; thus, the peak of the mobility pi is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory cell and the like, at a gate voltage of around 1 V.

This embodiment can be implemented by being combined as appropriate with any of the above embodiments.

Embodiment 3

A transistor in which an oxide semiconductor including In, Sn, and Zn as main components is used as a channel formation region can have favorable characteristics by depositing the oxide semiconductor while heating a substrate or by performing heat treatment after formation of an oxide semiconductor film. Note that a main component refers to an element included in a composition at 5 atomic % or more. Thus, in this embodiment, the case in which the field-effect mobility of the transistor is improved by intentionally heating the substrate after formation of the oxide semiconductor film will be described with reference to FIGS. 20A to 20C, FIGS. 21A and 21B, FIGS. 22A and 22B, FIG. 23, FIGS. 24A and 24B, FIG. 25, and FIG. 26.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 20A:
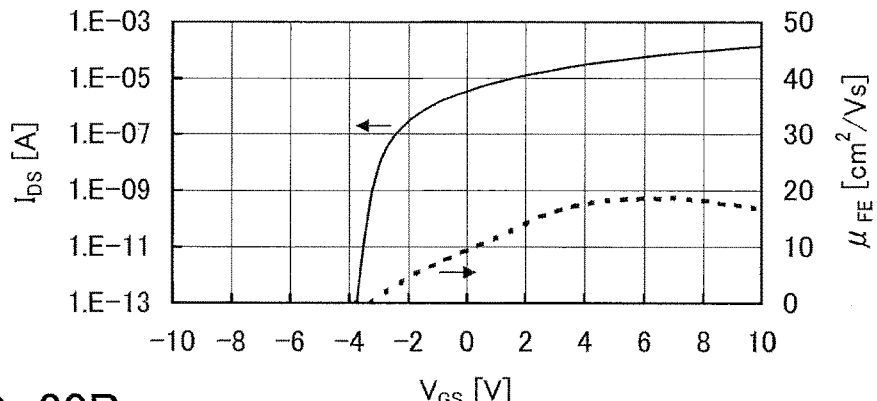
FIGS. 20A to 20C each show characteristics of a transistor including an oxide semiconductor film.
Figure 20B:
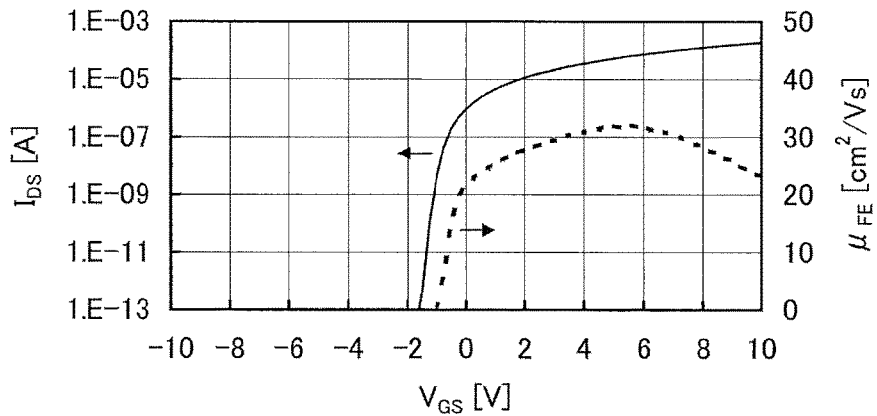
Figure 20C:
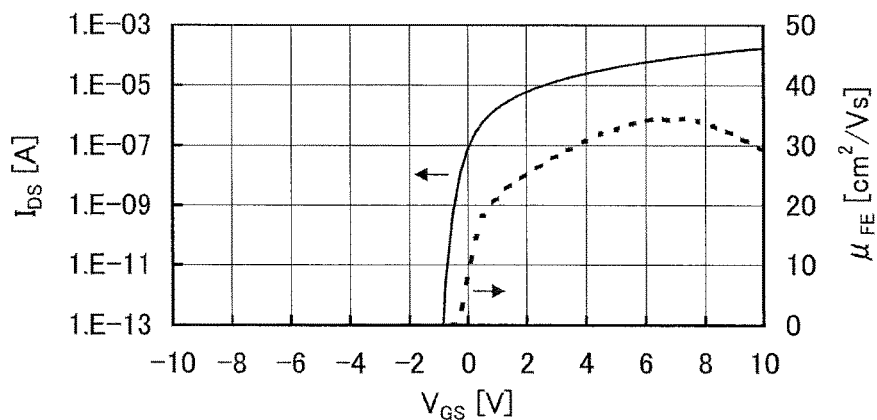

As an example, FIGS. 20A to 20C each show characteristics of a transistor in which an oxide semiconductor film including In, Sn, and Zn as main components and having a channel length L of 3 μm and a channel width W of 10 μm, and a gate insulating film with a thickness of 100 nm are used. Note that $V_d$ was set to 10 V.

FIG. 20A shows characteristics of a transistor whose oxide semiconductor film including In, Sn, and Zn as main components was formed by a sputtering method without heating a substrate intentionally. The field-effect mobility of the transistor is 18.8 $cm^2$/Vsec. On the other hand, when the oxide semiconductor film including In, Sn, and Zn as main components is formed while heating the substrate intentionally, the field-effect mobility can be improved. FIG. 20B shows characteristics of a transistor whose oxide semiconductor film including In, Sn, and Zn as main components was formed while heating a substrate at 200° C. The field-effect mobility of the transistor is 32.2 $cm^2$/Vsec.

The field-effect mobility can be further improved by performing heat treatment after formation of the oxide semiconductor film including In, Sn, and Zn as main components. FIG. 20C shows characteristics of a transistor whose oxide semiconductor film including In, Sn, and Zn as main components was formed by sputtering at 200° C. and then subjected to heat treatment at 650° C. The field-effect mobility of the transistor is 34.5 $cm^2$/Vsec.

The intentional heating of the substrate is expected to have an advantageous effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being purified by removal of impurities from the oxide semiconductor. In the case where such a purified non-single crystal oxide semiconductor is used, ideally, a field-effect mobility exceeding 100 $cm^2$/Vsec is expected to be realized.

The oxide semiconductor including In, Sn, and Zn as main components may be crystallized in the following manner: oxygen ions are implanted into the oxide semiconductor; hydrogen, a hydroxyl group, or moisture included in the oxide semiconductor is released by heat treatment; and the oxide semiconductor is crystallized through the heat treatment or by another heat treatment performed later. By such crystallization treatment or recrystallization treatment, a non-single crystal oxide semiconductor having favorable crystallinity can be obtained.

The intentional heating of the substrate during film formation and/or the heat treatment after the film formation contributes not only to improving field-effect mobility but also to making the transistor normally off. In a transistor whose oxide semiconductor film including In, Sn, and Zn as main components, which is formed without heating a substrate intentionally, is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 20A and 20B.

Note that the threshold voltage can also be controlled by changing the ratio of In, Sn, and Zn; when the composition ratio of In, Sn, and Zn is 2:1:3, a normally-off transistor is expected to be formed. In addition, a highly crystalline oxide semiconductor film can be obtained by setting the composition ratio of a target as follows: In:Sn:Zn=2:1:3.

The temperature of the intentional heating of the substrate or the temperature of the heat treatment is higher than or equal to 150° C., preferably higher than or equal to 200° C., or more preferably higher than or equal to 400° C. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for 1 hour, drift of the threshold voltage can be less than ±1.5 V, preferably less than ±1.0 V.

A BT test was performed on the following two transistors: Sample 1 on which heat treatment was not performed after formation of an oxide semiconductor film; and Sample 2 on which heat treatment at 650° C. was performed after formation of an oxide semiconductor film.

First, $V_{gs}$-$I_{ds}$ characteristics of the transistors were measured at a substrate temperature of 25° C. and $V_{ds}$ of 10 V. Then, the substrate temperature was set to 150° C. and $V_{ds}$ was set to 0.1 V. After that, 20 V of $V_{gs}$ was applied so that the intensity of an electric field applied to the gate insulating film 608 was 2 MV/cm, and the condition was kept for 1 hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a positive BT test.

In a similar manner, first, $V_{gs}$-$I_{ds}$ characteristics of the transistors were measured at a substrate temperature of 25° C. and $V_{ds}$ of 10 V. Then, the substrate temperature was set to 150° C. and $V_{ds}$ was set to 0.1 V. After that, 20 V of $V_{gs}$ was applied so that the intensity of an electric field applied to the gate insulating film 608 was 2 MV/cm, and the condition was kept for 1 hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a negative BT test.

Figure 21A:
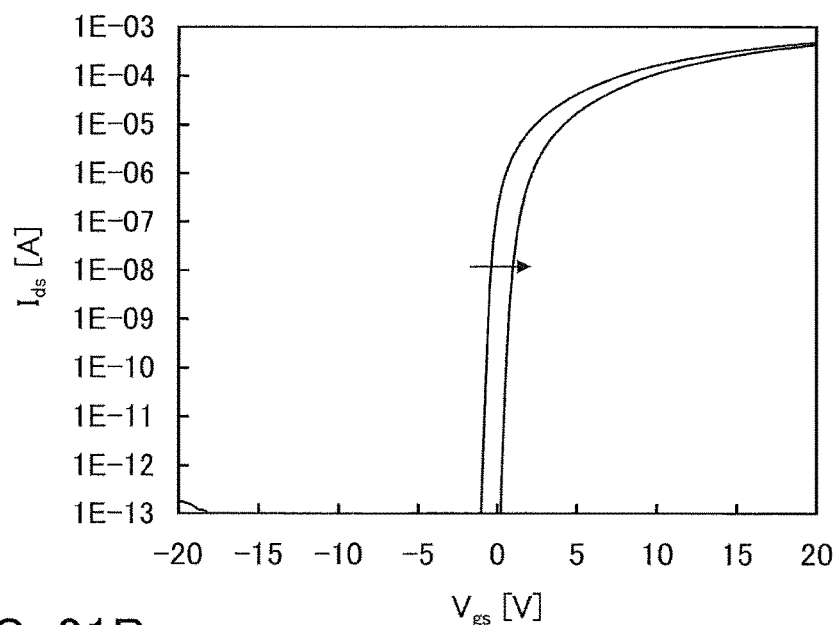
FIGS. 21A and 21B show $V_{gs}$-$I_{ds}$ characteristics after a BT test of a transistor of Sample 1.
Figure 21B:
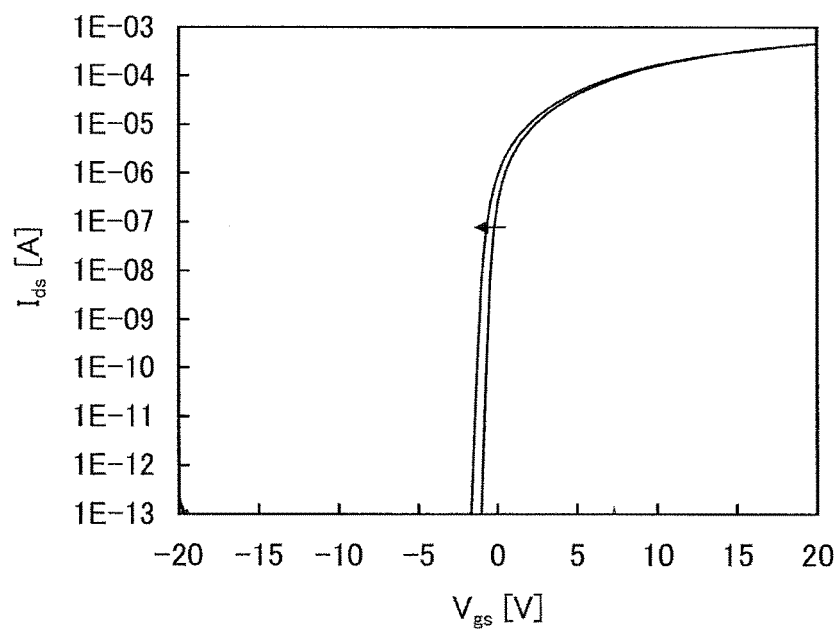
Figure 22A:
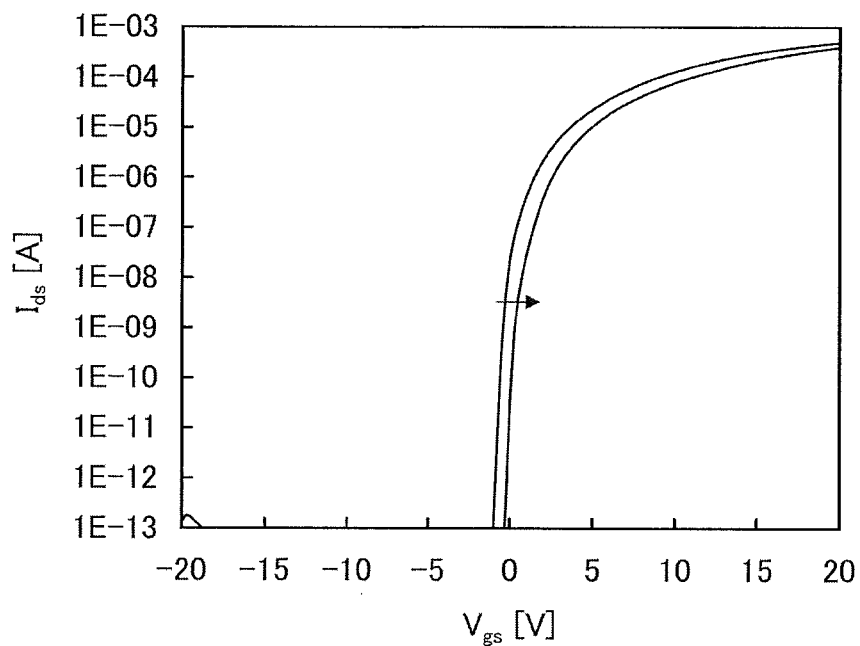
FIGS. 22A and 22B show $V_{gs}$-$I_{ds}$ characteristics after a BT test of a transistor of Sample 2.
Figure 22B:
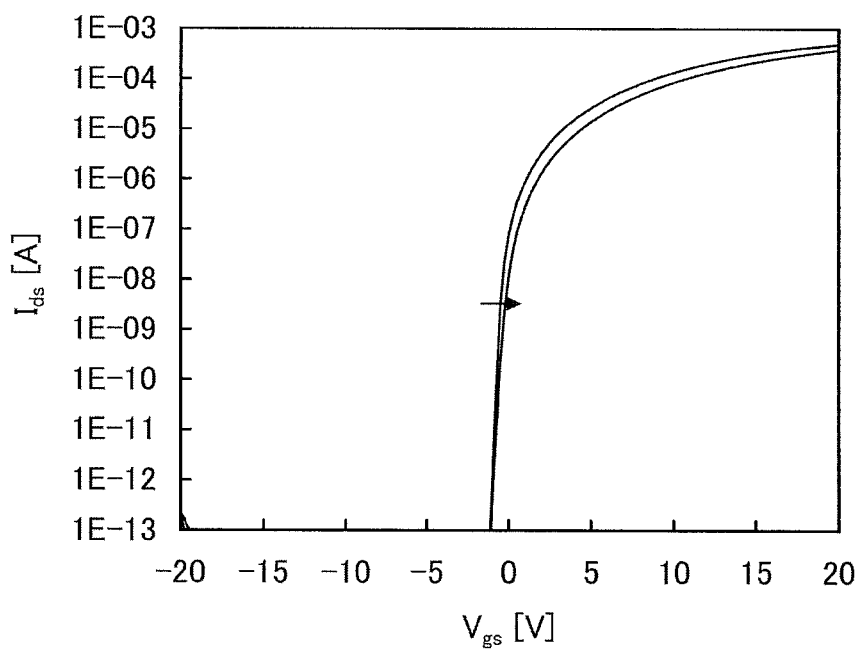

FIGS. 21A and 21B show a result of the positive BT test of Sample 1 and a result of the negative BT test of Sample 1, respectively. FIGS. 22A and 22B show a result of the positive BT test of Sample 2 and a result of the negative BT test of Sample 2, respectively.

The amounts of shift in the threshold voltage of Sample 1 due to the positive BT test and that due to the negative BT test were 1.80 V and −0.42 V, respectively. The amounts of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an advantageous effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is oxygen existing between lattices. When the concentration of excess oxygen is set to higher than or equal to $1\times10^{16}/cm^3$ and lower than or equal to $2\times10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis were performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for 1 hour and heat treatment in an oxygen atmosphere was further performed for 1 hour without lowering the temperature. A sample manufactured in this manner was used as Sample B.

Figure 25:
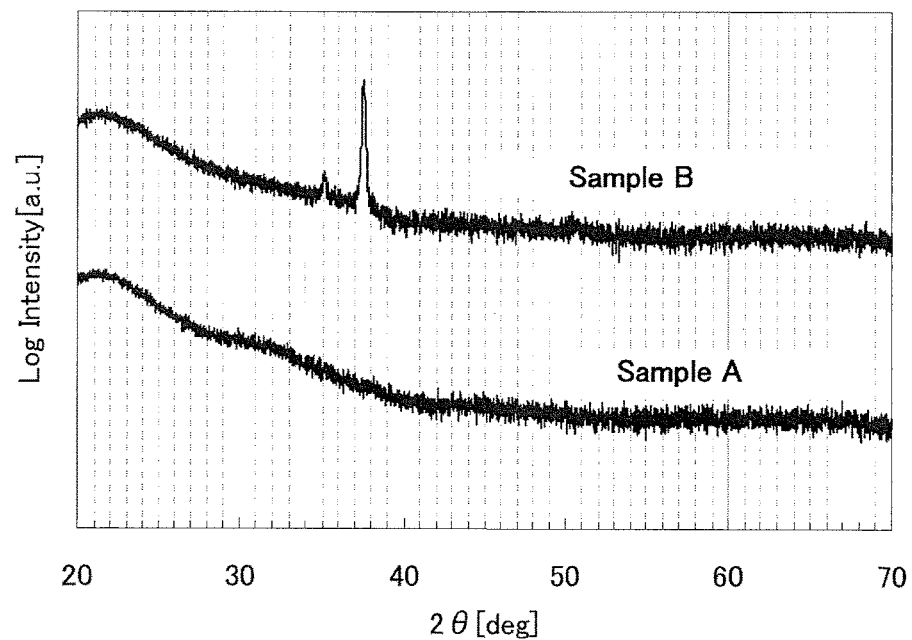
FIG. 25 is a graph showing XRD spectra of Sample A and Sample B.

FIG. 25 shows XRD spectra of Sample A and Sample B. No peak derived from crystal was observed in Sample A, whereas peaks derived from crystal were observed when 2θ was around 35 deg. and 37 deg. to 38 deg. in Sample B.

As described above, by intentionally heating the substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are adverse impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be lower than or equal to 1 aA/μm. Here, the unit of the off-state current represents current per micrometer of a channel width.

Figure 26:
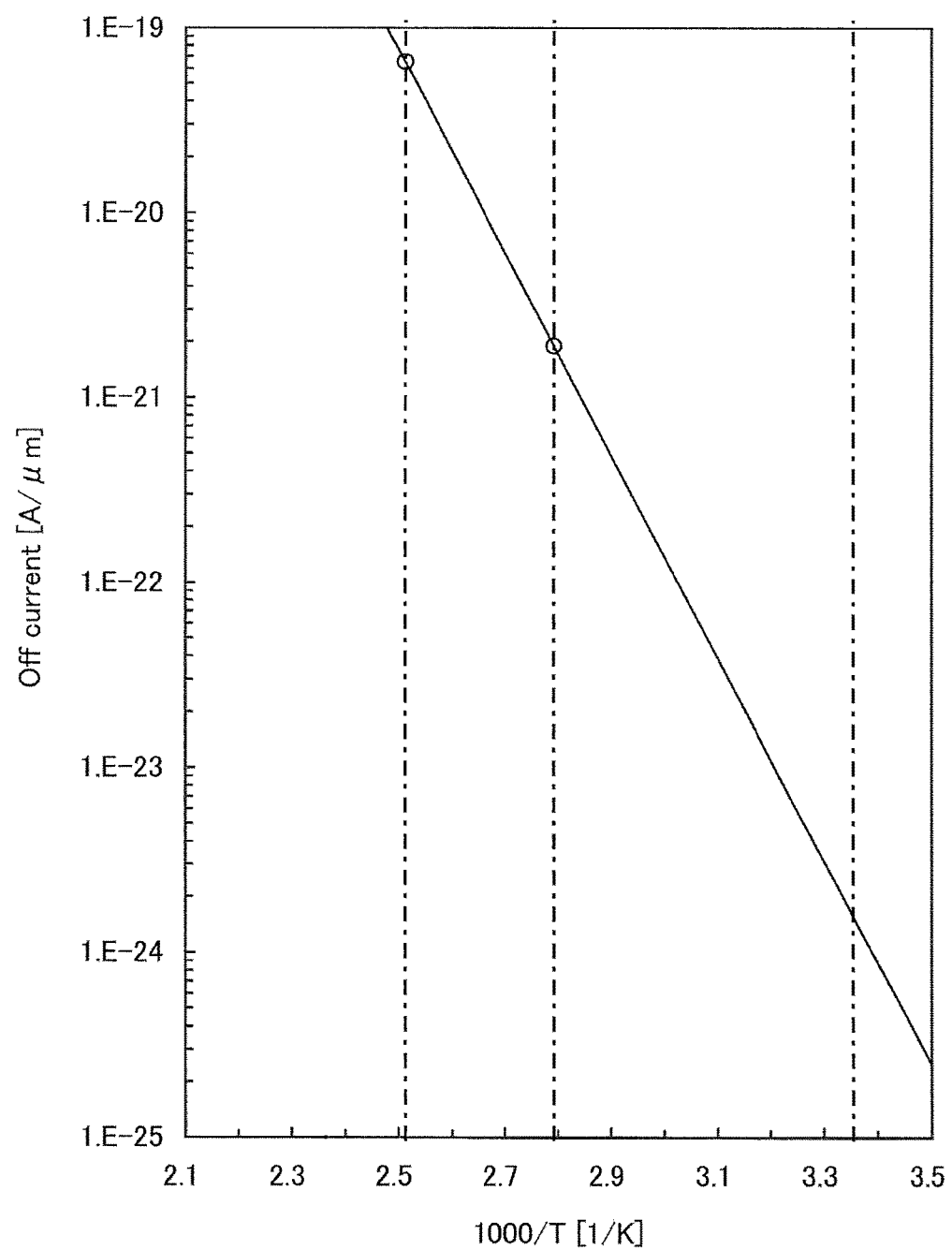
FIG. 26 is a graph showing the relation between off-state current of a transistor and substrate temperature.

FIG. 26 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 26, the off-state current can be lower than or equal to 1 aA/μm ($1\times10^{-18}$ A/μm), lower than or equal to 100 zA/μm ($1\times10^{-19}$ A/μm), and lower than or equal to 1 zA/μm ($1\times10^{-21}$ A/μm) when the substrate temperature is 125° C., 85° C., and room temperature (27° C.), respectively. Preferably, the off-state current can be lower than or equal to 0.1 aA/μm ($1\times10^{-19}$ A/μm), lower than or equal to 10 zA/μm ($1\times10^{-20}$ A/μm), and lower than or equal to 0.1 zA/μm ($1\times10^{-22}$ A/μm) at 125° C., 85° C., and room temperature, respectively.

Note that in order to prevent hydrogen and moisture from being included in the oxide semiconductor film during formation thereof, it is preferable to increase the purity of a sputtering gas by sufficiently suppressing leakage from the outside of a film formation chamber and degasification through an inner wall of the film formation chamber. For example, a gas with a dew point of lower than or equal to −70° C. is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor of Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_{ds}$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 23:
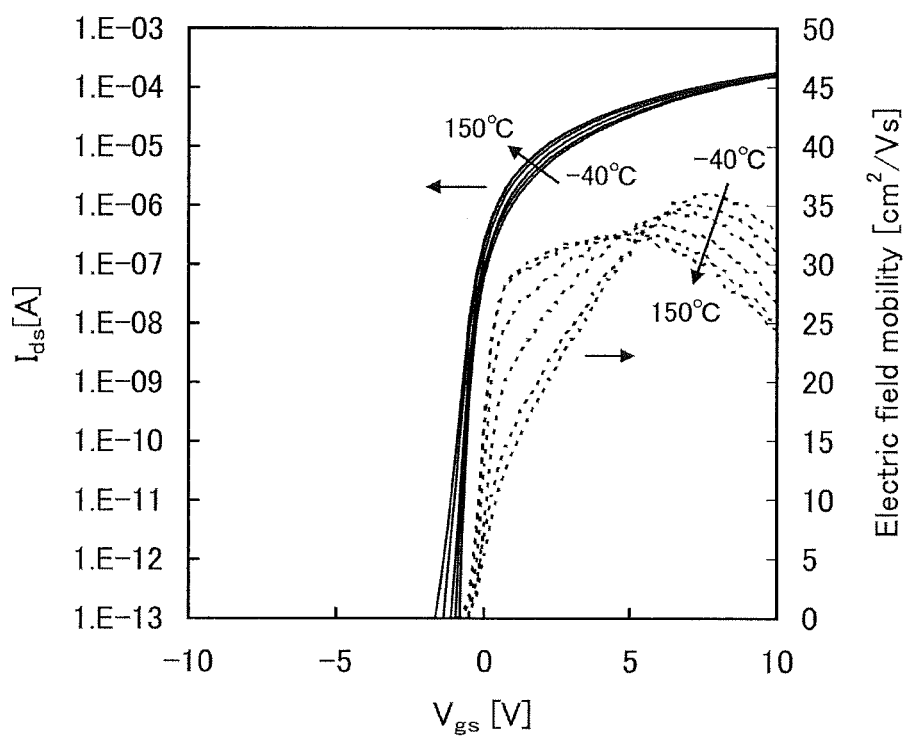
FIG. 23 is a graph showing $V_{gs}$ dependence of $I_{ds}$ and field effect mobility.
Figure 24A:
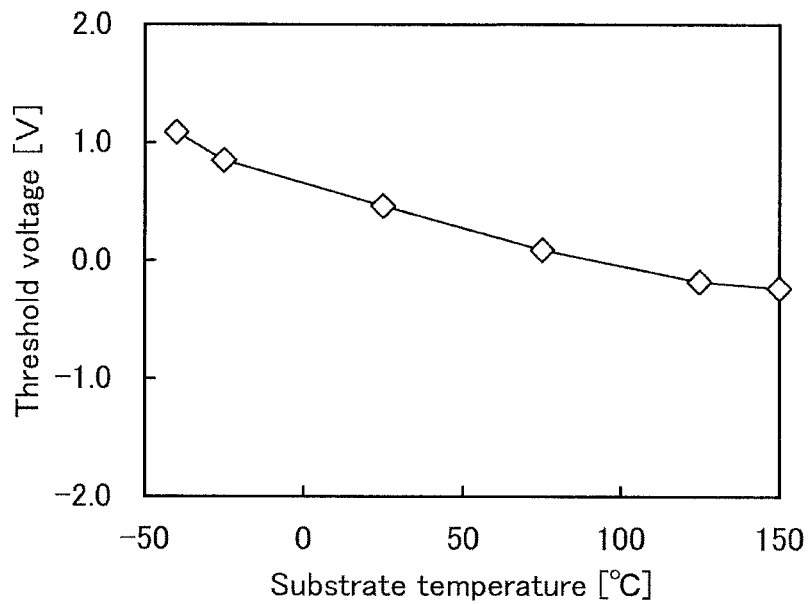
FIGS. 24A and 24B are a graph showing the relation between substrate temperature and threshold voltage and a graph showing the relation between substrate temperature and field effect mobility, respectively.

FIG. 23 shows the $V_{gs}$ dependence of $I_{ds}$ (a solid line) and field-effect mobility (a dotted line). FIG. 24A shows a relation between the substrate temperature and the threshold voltage, and FIG. 24B shows a relation between the substrate temperature and the field-effect mobility.

From FIG. 24A, it is found that the threshold voltage gets lower as the substrate temperature increases. Note that the threshold voltage is decreased from 1.09 V to −0.23 V in the range from −40° C. to 150° C.

Figure 24B:
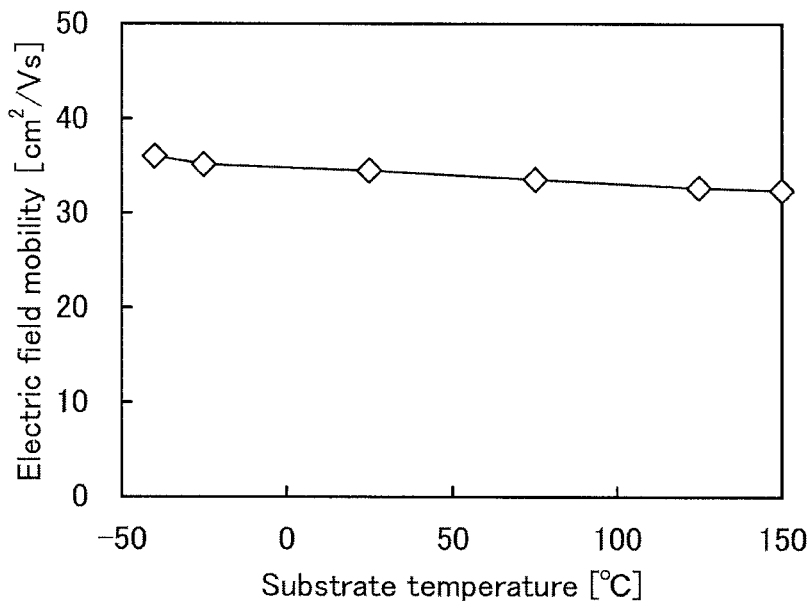

From FIG. 24B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of higher than or equal to 30 cm$^2$/Vsec, preferably higher than or equal to 40 cm$^2$/Vsec, or more preferably higher than or equal to 60 cm$^2$/Vsec can be obtained with the off-state current maintained at lower than or equal to 1 aA/μm, which can achieve on-state current needed for an LSI. For example, in an FET where L/W is 33 nm/40 nm, an on-state current of higher than or equal to 12 μA can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

This embodiment can be implemented by being combined as appropriate with any of the above embodiments.

Example 1

In this example, an example of a transistor in which an In—Sn—Zn—O film is used as an oxide semiconductor film will be described with reference to FIGS. 27A and 27B.

Figure 27A:
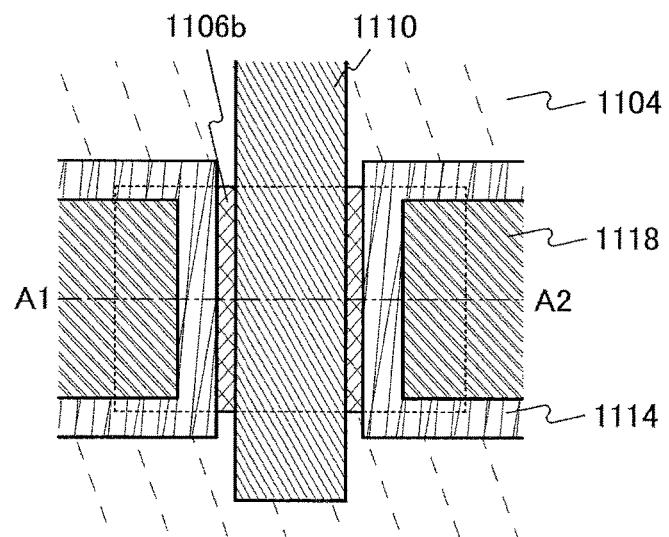
FIGS. 27A and 27B illustrate the structure of a transistor according to one embodiment of the present invention.
Figure 27B:
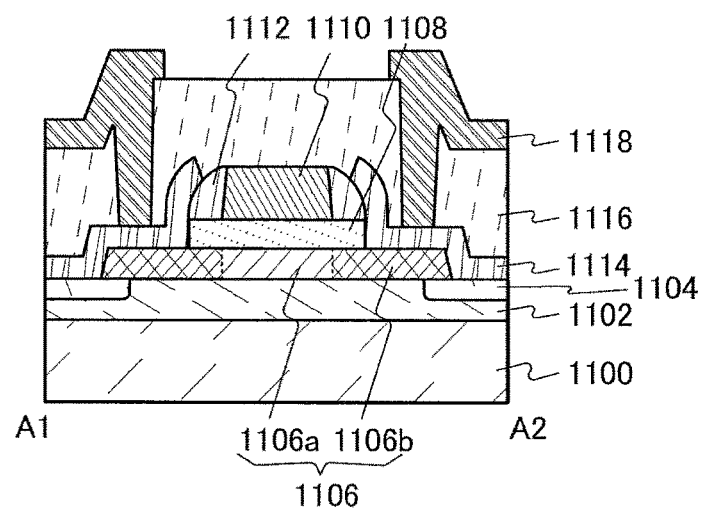

FIGS. 27A and 27B are a top view and a cross-sectional view of a coplanar transistor having a top-gate top-contact structure. FIG. 27A is the top view of the transistor. FIG. 27B illustrates cross section A1-A2 along dashed-dotted line A1-A2 in FIG. 27A.

The transistor illustrated in FIG. 27B includes a substrate 1101; a base insulating layer 1102 provided over the substrate 1101; a protective insulating film 1104 provided in the periphery of the base insulating layer 1102; an oxide semiconductor film 1106 provided over the base insulating layer 1102 and the protective insulating film 1104 and including a high-resistance region 1106a and low-resistance regions 1106b; a gate insulating film 1108 provided over the oxide semiconductor film 1106; a gate electrode 1110 provided so as to overlap with the oxide semiconductor film 1106 with the gate insulating film 1108 interposed therebetween; a sidewall insulating film 1112 provided in contact with a side surface of the gate electrode 1110; a pair of electrodes 1114 provided in contact with at least the low-resistance regions 1106b; an interlayer insulating film 1116 provided so as to cover at least the oxide semiconductor film 1106, the gate electrode 1110, and the pair of electrodes 1114; and a wiring 1118 provided so as to be connected to at least one of the pair of electrodes 1114 through an opening formed in the interlayer insulating film 1116.

Although not illustrated, a protective film may be provided so as to cover the interlayer insulating film 1116 and the wiring 1118. With the protective film, a minute amount of leakage current generated by surface conduction of the interlayer insulating film 1116 can be reduced and thus the off-state current of the transistor can be reduced.

This example can be implemented by being combined as appropriate with any of the above embodiments.

Example 2

In this example, another example of a transistor in which an In—Sn—Zn—O film is used as an oxide semiconductor film will be described.

Figure 28A:
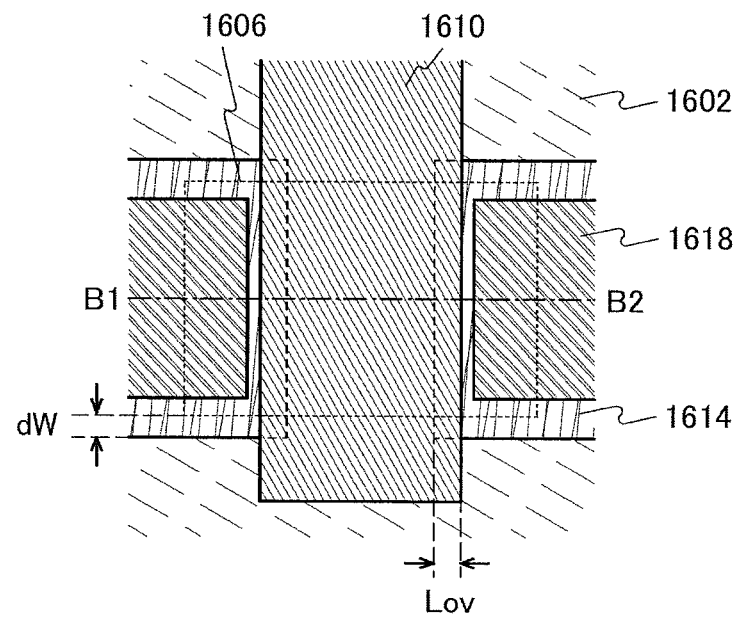
FIGS. 28A and 28B illustrate the structure of a transistor according to one embodiment of the present invention.
Figure 28B:
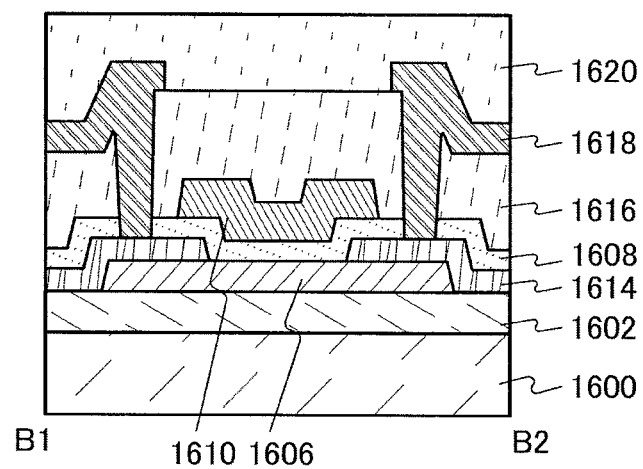

FIGS. 28A and 28B are a top view and a cross-sectional view which illustrate a structure of a transistor manufactured in this example. FIG. 28A is the top view of the transistor. FIG. 28B illustrates cross section B1-B2 along dashed-dotted line B1-B2 in FIG. 28A.

The transistor illustrated in FIG. 28B includes a substrate 1600; a base insulating layer 1602 provided over the substrate 1600; an oxide semiconductor film 1606 provided over the base insulating layer 1602; a pair of electrodes 1614 provided in contact with the oxide semiconductor film 1606; a gate insulating film 1608 provided over the oxide semiconductor film 1606 and the pair of electrodes 1614; a gate electrode 1610 provided so as to overlap with the oxide semiconductor film 1606 with the gate insulating film 1608 interposed therebetween; an interlayer insulating film 1616 provided so as to cover the gate insulating film 1608 and the gate electrode 1610; wirings 1618 connected to the pair of electrodes 1614 through openings formed in the interlayer insulating film 1616; and a protective film 1620 provided so as to cover the interlayer insulating film 1616 and the wirings 1618.

As the substrate 1600, a glass substrate can be used. As the base insulating layer 1602, a silicon oxide film can be used. As the oxide semiconductor film 1606, an In—Sn—Zn—O film can be used. As the pair of electrodes 1614, a tungsten film can be used. As the gate insulating film 1608, a silicon oxide film can be used. The gate electrode 1610 can have a stacked-layer structure of a tantalum nitride film and a tungsten film. The interlayer insulating film 1616 can have a stacked-layer structure of a silicon oxynitride film and a polyimide film. The wirings 1618 can each have a stacked-layer structure in which a titanium film, an aluminum film, and a titanium film are formed in this order. As the protective film 1620, a polyimide film can be used.

Note that in the transistor having the structure illustrated in FIG. 28A, the width of a portion where the gate electrode 1610 overlaps with one of the pair of electrodes 1614 is referred to as Lov. Similarly, the width of a portion where the pair of electrodes 1614, which does not overlap with the oxide semiconductor film 1606, is referred to as dW.

This example can be implemented by being combined as appropriate with any of the above embodiments.

Example 3

This example gives an example of a semiconductor device having the above memory device. The semiconductor device can have higher reliability and can be miniaturized by using the memory device according to one embodiment of the present invention. In particular, in the case where a portable semiconductor device is used, an advantage in improving convenience of users can be obtained as long as the semiconductor device can be miniaturized by using the memory device according to one embodiment of the present invention.

Figure 11A:
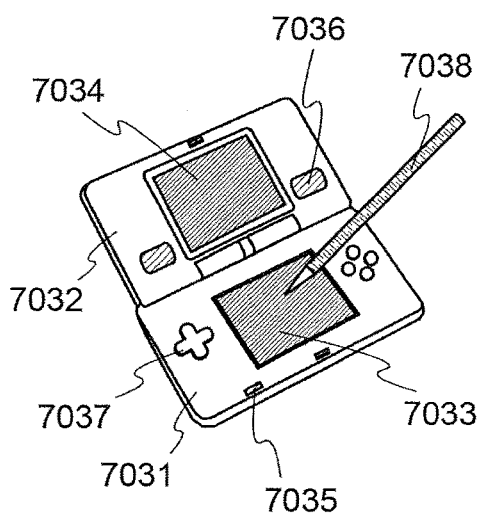
FIGS. 11A to 11C are diagrams showing specific examples of a semiconductor device.
Figure 11B:
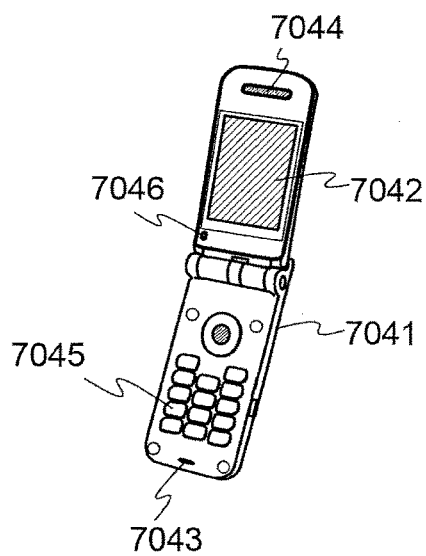
Figure 11C:
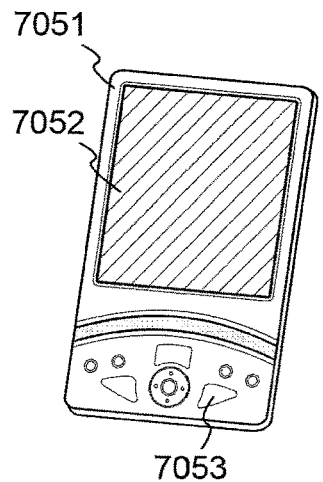

The memory device according to one embodiment of the present invention can be used for display devices, laptop personal computers, or image reproducing devices provided with recording media (typically, devices which reproduce the content of recording media such as digital versatile discs (DVDs) and have displays for displaying the reproduced images). Other than the above, as a semiconductor device which can use the memory device according to one embodiment of the present invention, mobile phones, portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 11A to 11C illustrate specific examples of these semiconductor devices.

FIG. 11A illustrates a portable game machine including a housing 7031, a housing 7032, a display portion 7033, a display portion 7034, a microphone 7035, speakers 7036, an operation key 7037, a stylus 7038, and the like. The memory device according to one embodiment of the present invention can be used for an integrated circuit for controlling driving of the portable game machine. With the use of the memory device according to one embodiment of the present invention for the integrated circuit for controlling driving of the portable game machine, a highly reliable portable game machine and a compact portable game machine can be provided. Although the portable game machine illustrated in FIG. 11A includes two display portions, the display portion 7033 and the display portion 7034, the number of display portions included in the portable game machine is not limited to two.

FIG. 11B illustrates a mobile phone including a housing 7041, a display portion 7042, an audio input portion 7043, an audio output portion 7044, operation keys 7045, a light-receiving portion 7046, and the like. Light received in the light-receiving portion 7046 is converted into electrical signals, whereby external images can be loaded. The memory device according to one embodiment of the present invention can be used for an integrated circuit for controlling driving of the mobile phone. With the use of the memory device according to one embodiment of the present invention for the integrated circuit for controlling driving of the mobile phone, a highly reliable mobile phone and a compact mobile phone can be provided.

FIG. 11C illustrates a portable information terminal including a housing 7051, a display portion 7052, operation keys 7053, and the like. A modem may be incorporated in the housing 7051 of the portable information terminal illustrated in FIG. 11C. The memory device according to one embodiment of the present invention can be used for an integrated circuit for controlling driving of the portable information terminal. With the use of the memory device according to one embodiment of the present invention for the integrated circuit for controlling driving of the portable information terminal, a highly reliable portable information terminal and a compact portable information terminal can be provided.

This application is based on Japanese Patent Application serial No. 2010-205253 filed with the Japan Patent Office on Sep. 14, 2010 and 2011-112791 filed with the Japan Patent Office on May 19, 2011, the entire contents of which are hereby incorporated by reference.

What is claimed is:

1. A memory device comprising:
a substrate;
a first cell array comprising first memory cells formed over the substrate;
a second cell array comprising second memory cells formed over the substrate;
a first bit line driver circuit formed over the substrate;
a second bit line driver circuit formed over the substrate; and
a word line driver circuit formed over the substrate,
wherein the first bit line driver circuit is electrically connected to the first cell array,
wherein the second bit line driver circuit is electrically connected to the second cell array,
wherein the word line driver circuit is electrically connected to the first cell array and the second cell array,
wherein the first cell array and the second cell array overlap with the first bit line driver circuit and the second bit line driver circuit, respectively.

2. The memory device according to claim 1, wherein the first memory cells and second memory cells comprise transistors comprising a channel formation region in an oxide semiconductor film formed over the substrate.

3. The memory device according to claim 1, wherein an aluminum oxide layer is interposed between the memory cell and the substrate.

4. A semiconductor device comprising the memory device according to claim 1.

5. The memory device according to claim 1, wherein the first bit line driver circuit is provided adjacently to the second bit line driver circuit.

6. A memory device comprising:
a semiconductor substrate;
a cell array comprising memory cells formed over the semiconductor substrate; and
a bit line driver circuit formed over the semiconductor substrate;
wherein the memory cell comprises a first transistor and a capacitor,
wherein the bit line driver circuit comprises a second transistor,
wherein one of a source electrode and a drain electrode of the first transistor is electrically connected to the bit line driver circuit,
wherein other of the source electrode and the drain electrode of the first transistor is electrically connected to a first electrode of the capacitor,
wherein the first electrode of the capacitor is over a second electrode of the capacitor,
wherein the first transistor comprises a channel formation region in an oxide semiconductor film formed over the semiconductor substrate,
wherein the second transistor comprises a channel formation region in the semiconductor substrate, and
wherein the cell array overlaps with the bit line driver circuit.

7. The memory device according to claim 6, wherein the semiconductor substrate is not formed from an oxide semiconductor material.

8. The memory device according to claim 6, wherein an aluminum oxide layer is interposed between the oxide semiconductor film and the semiconductor substrate.

9. A semiconductor device comprising the memory device according to claim 6.

10. A memory device comprising:
a semiconductor substrate;
a first cell array comprising first memory cells formed over the semiconductor substrate;
a second cell array comprising second memory cells formed over the semiconductor substrate; and a driver circuit comprising:
  a third transistor;
  a first bit line driver circuit;
  a second bit line driver circuit; and
a word line driver circuit,
wherein the first memory cell comprises first transistor,
wherein the second memory cell comprises second transistor,
wherein one of a source and a drain of the first transistor is electrically connected to the first bit line driver circuit,
wherein a gate of the first transistor is electrically connected to the word line driver circuit,
wherein one of a source and a drain of the second transistor is electrically connected to the second bit line driver circuit,
wherein a gate of the second transistor is electrically connected to the word line driver circuit,
wherein the first transistor comprises a channel formation region in an oxide semiconductor film formed over the semiconductor substrate,
wherein the second transistor comprises a channel formation region in an oxide semiconductor film formed over the semiconductor substrate,
wherein the third transistor comprises a channel formation region in the semiconductor substrate, and
wherein the first transistor and the second transistor are over the third transistor.

11. The memory device according to claim 10, wherein the semiconductor substrate is not formed from an oxide semiconductor material.

12. The memory device according to claim 10, wherein the channel formation region of the third transistor is comprised in polycrystalline silicon, single crystal silicon, polycrystalline germanium, or single crystal germanium.

13. The memory device according to claim 10, wherein an aluminum oxide layer is interposed between the oxide semiconductor film and the semiconductor substrate.

14. A semiconductor device comprising the memory device according to claim 10.

* * * * *